(12) United States Patent
Li et al.

(10) Patent No.: US 10,811,082 B1
(45) Date of Patent: Oct. 20, 2020

(54) NON-VOLATILE MEMORY WITH FAST DATA CACHE TRANSFER SCHEME

(71) Applicant: SanDisk Technologies LLC, Addison, TX (US)

(72) Inventors: YenLung Li, San Jose, CA (US); Hua-Ling Cynthia Hsu, Milpitas, CA (US); Chen Chen, Mountain View, CA (US); Min Peng, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/450,058

(22) Filed: Jun. 24, 2019

(51) Int. Cl.
| | | |
|---|---|---|
| *G11C 7/18* | (2006.01) | |
| *G11C 11/409* | (2006.01) | |
| *G06F 3/06* | (2006.01) | |

(52) U.S. Cl.
CPC ............ *G11C 11/409* (2013.01); *G06F 3/061* (2013.01); *G06F 3/0629* (2013.01); *G06F 3/0653* (2013.01); *G06F 3/0674* (2013.01); *G11C 7/18* (2013.01)

(58) Field of Classification Search
CPC .................................... G11C 7/22; G11C 8/10
USPC ........................................ 365/189.05, 230.06
See application file for complete search history.

(56) References Cited

U.S. PATENT DOCUMENTS

| | | | | |
|---|---|---|---|---|
| 5,072,377 A | * | 12/1991 | Asai ..................... | G06F 9/4494 711/216 |
| 5,323,387 A | * | 6/1994 | Miyata ................... | H04L 45/16 370/235 |
| 5,434,990 A | | 7/1995 | Moussavi et al. | |
| 5,630,048 A | * | 5/1997 | La Joie .................. | G06F 11/25 714/25 |
| 6,040,997 A | | 3/2000 | Estakhri | |
| 6,239,815 B1 | * | 5/2001 | Frink ..................... | H04N 19/00 341/60 |
| 6,353,553 B1 | * | 3/2002 | Tamada .............. | G11C 11/5621 365/185.03 |
| 7,577,037 B2 | | 8/2009 | Li et al. | |
| 8,634,248 B1 | * | 1/2014 | Sprouse .............. | G11C 11/5642 365/185.17 |
| 8,842,473 B2 | * | 9/2014 | Tsai ..................... | G11C 29/848 365/185.09 |
| 8,902,647 B1 | * | 12/2014 | Raghu ................ | G11C 16/3427 365/185.02 |
| 9,431,120 B1 | | 8/2016 | Tuers et al. | |

(Continued)

OTHER PUBLICATIONS

U.S. Appl. No. 16/450,042, filed Jun. 24, 2019 by Li et al.

(Continued)

*Primary Examiner* — Michael T Tran
(74) *Attorney, Agent, or Firm* — Vierra Magen Marcus LLP

(57) ABSTRACT

In a non-volatile memory circuit, read and write performance is improved by increasing the transfer rate of data through the cache buffer during read and write operations. In an array structure where memory cells are connected along bit lines, and the bit lines organized into columns, pairs of data words are stored interleaved on the bit lines of a pair of columns. Data is transferred in and out of the read and write circuit on an internal bus structure, where part of the transfer of one word stored on a pair of columns can overlap with part of the transfer of another word, accelerating transfer times for both read and write.

20 Claims, 18 Drawing Sheets

(56) References Cited

U.S. PATENT DOCUMENTS

| | | | | |
|---|---|---|---|---|
| 10,467,146 | B1* | 11/2019 | Miyamura | G11B 27/00 |
| 2003/0116763 | A1 | 6/2003 | Yamazaki et al. | |
| 2003/0218925 | A1* | 11/2003 | Torjussen | G06F 11/08 |
| | | | | 365/200 |
| 2004/0044812 | A1* | 3/2004 | Holm | G06F 13/4018 |
| | | | | 710/110 |
| 2004/0066669 | A1 | 4/2004 | Ooishi | |
| 2005/0273670 | A1* | 12/2005 | Park | G11C 29/785 |
| | | | | 714/43 |
| 2007/0223292 | A1 | 9/2007 | Moogat et al. | |
| 2008/0282041 | A1* | 11/2008 | Hartwich | H04L 49/90 |
| | | | | 711/147 |
| 2012/0113716 | A1 | 5/2012 | Liu et al. | |
| 2014/0075259 | A1* | 3/2014 | Tam | G06F 11/1044 |
| | | | | 714/747 |
| 2014/0136762 | A1* | 5/2014 | Li | G06F 12/0246 |
| | | | | 711/103 |
| 2014/0136763 | A1* | 5/2014 | Li | G11C 16/3459 |
| | | | | 711/103 |
| 2014/0136764 | A1* | 5/2014 | Li | G11C 16/08 |
| | | | | 711/103 |
| 2014/0298075 | A1* | 10/2014 | Rao | G06F 13/4291 |
| | | | | 713/600 |
| 2015/0003156 | A1* | 1/2015 | Berckmann | G11C 29/88 |
| | | | | 365/185.09 |
| 2016/0163382 | A1* | 6/2016 | Conley | G11C 29/52 |
| | | | | 365/185.03 |
| 2016/0365154 | A1* | 12/2016 | Nagadomi | G11C 11/5628 |
| 2017/0097869 | A1* | 4/2017 | Sharon | G11C 11/5642 |
| 2017/0117036 | A1 | 4/2017 | Al-Shamma et al. | |
| 2017/0153974 | A1* | 6/2017 | Jin | G06F 12/06 |
| 2018/0300208 | A1* | 10/2018 | Oruganti | G06F 3/0619 |
| 2019/0050169 | A1 | 2/2019 | Komai | |
| 2019/0057746 | A1 | 2/2019 | Komai | |
| 2019/0303236 | A1* | 10/2019 | Ellis | G06F 3/0619 |

OTHER PUBLICATIONS

International Search Report & The Written Opinion of the International Searching Authority dated Mar. 31, 2020, International Application No. PCT/US2019/066422.

International Search Report & The Written Opinion of the International Searching Authority dated Apr. 7, 2020, International Application No. PCT/US2019/066421.

Non-final Office Action dated Apr. 22, 2020, U.S. Appl. No. 16/450,042, filed Jun. 24, 2019.

Response to Office Action dated Jun. 18, 2020, U.S. Appl. No. 16/450,042, filed Jun. 24, 2019.

Notice of Allowance dated Jul. 1, 2020, U.S. Appl. No. 16/450,042, filed Jun. 24, 2019.

* cited by examiner

| BL | SA | I/O | Col # | Col # |
|---|---|---|---|---|
| BL0 | SA0 | IO0 | L0 | H0 |
| BL1 | SA8 | IO0 | L0 | H0 |
| BL2 | SA1 | IO1 | L0 | H0 |
| BL3 | SA9 | IO1 | L0 | H0 |
| BL4 | SA2 | IO2 | L0 | H0 |
| BL5 | SA10 | IO2 | L0 | H0 |
| BL6 | SA3 | IO3 | L0 | H0 |
| BL7 | SA11 | IO3 | L0 | H0 |
| BL8 | SA4 | IO4 | L0 | H0 |
| BL9 | SA12 | IO4 | L0 | H0 |
| BL10 | SA5 | IO5 | L0 | H0 |
| BL11 | SA13 | IO5 | L0 | H0 |
| BL12 | SA6 | IO6 | L0 | H0 |
| BL13 | SA14 | IO6 | L0 | H0 |
| BL14 | SA7 | IO7 | L0 | H0 |
| BL15 | SA15 | IO7 | L0 | H0 |
| BL0 | SA0 | IO0 | L1 | H1 |
| BL1 | SA8 | IO0 | L1 | H1 |
| BL2 | SA1 | IO1 | L1 | H1 |
| BL3 | SA9 | IO1 | L1 | H1 |
| BL4 | SA2 | IO2 | L1 | H1 |
| BL5 | SA10 | IO2 | L1 | H1 |
| BL6 | SA3 | IO3 | L1 | H1 |
| BL7 | SA11 | IO3 | L1 | H1 |
| BL8 | SA4 | IO4 | L1 | H1 |
| BL9 | SA12 | IO4 | L1 | H1 |
| BL10 | SA5 | IO5 | L1 | H1 |
| BL11 | SA13 | IO5 | L1 | H1 |
| BL12 | SA6 | IO6 | L1 | H1 |
| BL13 | SA14 | IO6 | L1 | H1 |
| BL14 | SA7 | IO7 | L1 | H1 |
| BL15 | SA15 | IO7 | L1 | H1 |

NON-VOLATILE MEMORY WITH FAST DATA CACHE TRANSFER SCHEME

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories. Typically, the memory device has a memory controller and one or more memory packages. The memory package has one or more logical units. As one example, each logical unit can be a separate memory die. Each memory die contains non-volatile storage elements (e.g., non-volatile memory cells), as well as read and write circuitry. The memory package also contains addressing circuitry in order to properly address the memory cells. As one example, the memory package includes NAND flash memory. However, memory packages other than NAND flash are known.

The read and write circuitry on a memory die include a number of latches to buffer data being read out of and programmed into the array of memory cells on the die. The number of such latches is related to the number of memory cells sensed concurrently, the format of the data (the number of data states stored in a cell), and other factors. The number and arrangement of the data latches can affect performance as they can determine how efficiently data can be transferred on and off a memory die. As the number of circuits in the data latch structure can be quite large, this can consume a non-negligible area of the memory die that could otherwise be used for memory cells. Consequently, the detail of the memory latch structure on a non-volatile memory die can be have significance for both the performance and storage density of the memory device.

BRIEF DESCRIPTION OF THE DRAWINGS

FIG. 6 illustrates the layout of the bit lines and sense amplifiers into columns.

FIG. 8 is a schematic illustration of an embodiment for a memory array where half logic words from different logic words are interleaved within a single column.

DETAILED DESCRIPTION

The performance of a memory circuit is based on the rate at which data can be read from and programmed to the memory cells of the memory circuit. The circuitry used for the reading and writing of data in a non-volatile memory circuit includes a data cache structure of a number of data latches that are used to store the data to be written to and read from the memory cells of the memory circuit. The moving of data in and out of these data latches consume part of the time involved in reading and writing data, so that any improvement in these data transfers will improve memory performance.

In a memory array structure where memory cells are connected along bit lines, and the bit lines are organized into columns, each of the columns has an associated set of data latches. Data that is read from, or to be programmed to, the memory cells of each column is stored in a set of data latches associated with the columns. To more efficiently move the data in and out of these data latches, rather than store the data of a single word of data on a single column, the bits of pairs of data words can be interleaved on the bit lines of a pair of columns. Each of the words of data has a corresponding set of data latches, to hold the data read from or to be written to a memory cells, and a set of transfer latches, to hold data being transferred between a data bus the data latches. For given word of data, in a write process a word of data is transferred from the data bus to the transfer latches, and from the transfer latches to the data latches where it is used for the write process; and in a read process sensed data is transferred from the data latches to the transfer latches, and then from the transfer latches to the data bus. To improve read and write performance, the transfer of one word of data between the data latches and the transfer latches can be hidden behind the transfer of another word of data between the transfer latches and the data bus.

Figure 1:
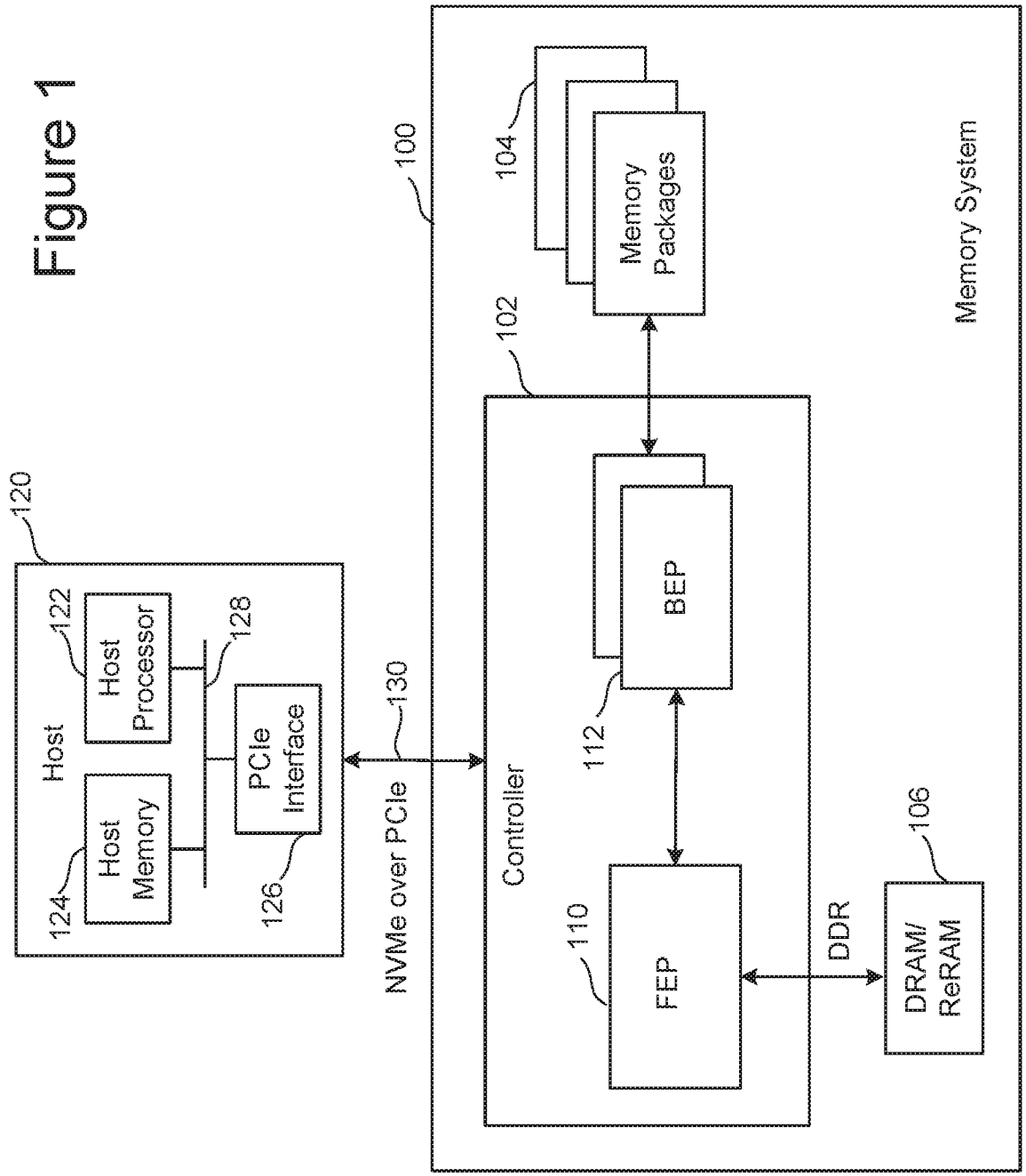
FIG. 1 is a block diagram of one embodiment of a memory system connected to a host.

FIG. 1 is a block diagram of one embodiment of a memory system 100 connected to a host 120. Memory system 100 can implement the technology proposed herein, where data are received from and transferred to the host 120. Depending on the embodiment, the inputs can be received from the host 120 and then provided to the memory packages 104 for inferencing on the weights previously programmed into the memory arrays of the memory packages 104. Many different types of memory systems can be used with the technology proposed herein. Example memory systems include solid state drives ("SSDs"), memory cards and embedded memory devices; however, other types of memory systems can also be used.

Memory system 100 of FIG. 1 comprises a Controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. The ASICs for each of the BEP circuits 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 104 utilize NAND flash memory (including two dimensional NAND flash memory and/or three-dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. Host 120 is external to and separate from memory system 100. In one embodiment, memory system 100 is embedded in host 120.

Figure 2:
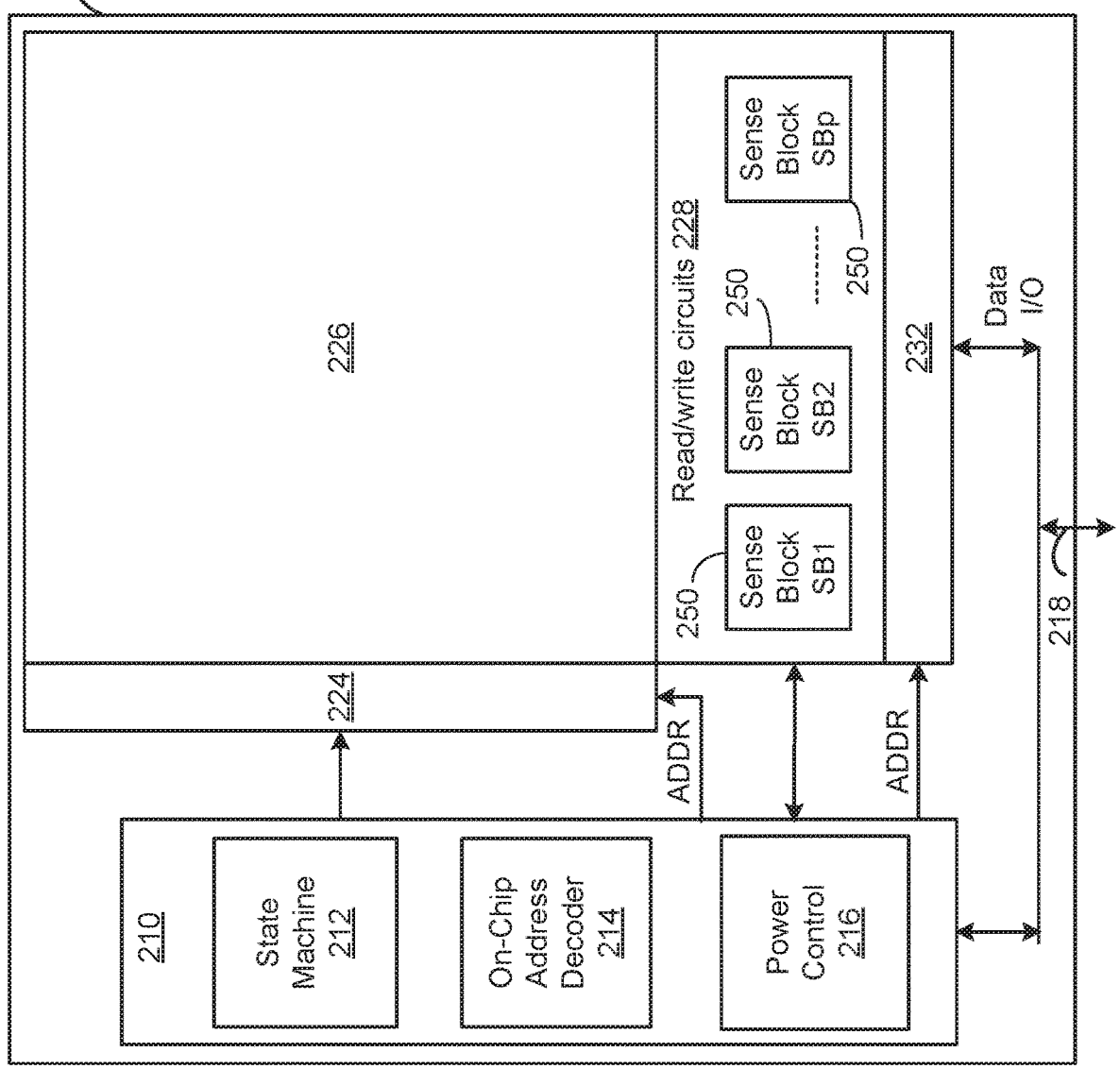
FIG. 2 is a block diagram of one embodiment of a memory die.

FIG. 2 is a functional block diagram of one embodiment of a memory die 200. The components depicted in FIG. 2 are electrical circuits. In one embodiment, each memory die 200 includes a memory structure 226, control circuitry 210, and read/write circuits 228. Memory structure 226 is addressable by word lines via a row decoder 224 and by bit lines via a column decoder 232. The read/write circuits 228 include multiple sense blocks 250 including SB1, SB2, . . . , SBp (sensing circuitry) and allow a page of memory cells to be read or programmed in parallel. Commands and data are transferred between the Controller and the memory die 200 via lines 218. In one embodiment, memory die 200 includes a set of input and/or output (I/O) pins that connect to lines 218.

Control circuitry 210 cooperates with the read/write circuits 228 to perform memory operations (e.g., write, read, and others) on memory structure 226, and includes a state machine 212, an on-chip address decoder 214, and a power control circuit 216. State machine 212 provides die-level control of memory operations. In one embodiment, state machine 212 is programmable by software. In other embodiments, state machine 212 does not use software and is completely implemented in hardware (e.g., electrical circuits). In another embodiment, state machine 212 is replaced by a micro-controller. In one embodiment, control circuitry 210 includes buffers such as registers, ROM fuses and other storage devices for storing default values such as base voltages and other parameters.

The on-chip address decoder 214 provides an address interface between addresses used by Controller 102 to the hardware address used by the decoders 224 and 232. Power control module 216 controls the power and voltages supplied to the word lines and bit lines during memory operations. Power control module 216 may include charge pumps for creating voltages. The sense blocks include bit line drivers.

For purposes of this document, the phrase "one or more control circuits" refers to a controller, a state machine, a micro-controller and/or control circuitry 210, or other analogous circuits that are used to control non-volatile memory.

In one embodiment, memory structure 226 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 226 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 226 is not limited to the examples above. Many different types of memory array architectures or memory technologies can be used to form memory structure 226. No particular non-volatile memory technology is required for purposes of the new claimed embodiments proposed herein. Other examples of suitable technologies for memory cells of the memory structure 226 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three-dimensional arrays, cross-point arrays, stacked two dimensional arrays, vertical bit line arrays, and the like.

One example of a ReRAM is a cross point memory that includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

As noted above, the memory structure 226 is typically structured as an array of memory cells formed along word lines and bit lines, where the word lines are addressable via a row decoder 224 and bit lines are addressable via a column decoder 232. To sense the state of the memory cells, the bit lines are connected to the read/write circuits 228 that include the multiple sense blocks 250 including SB1, SB2, . . . , SBp (sensing circuitry), allowing a page of memory cells to be read or programmed in parallel.

Figure 3:
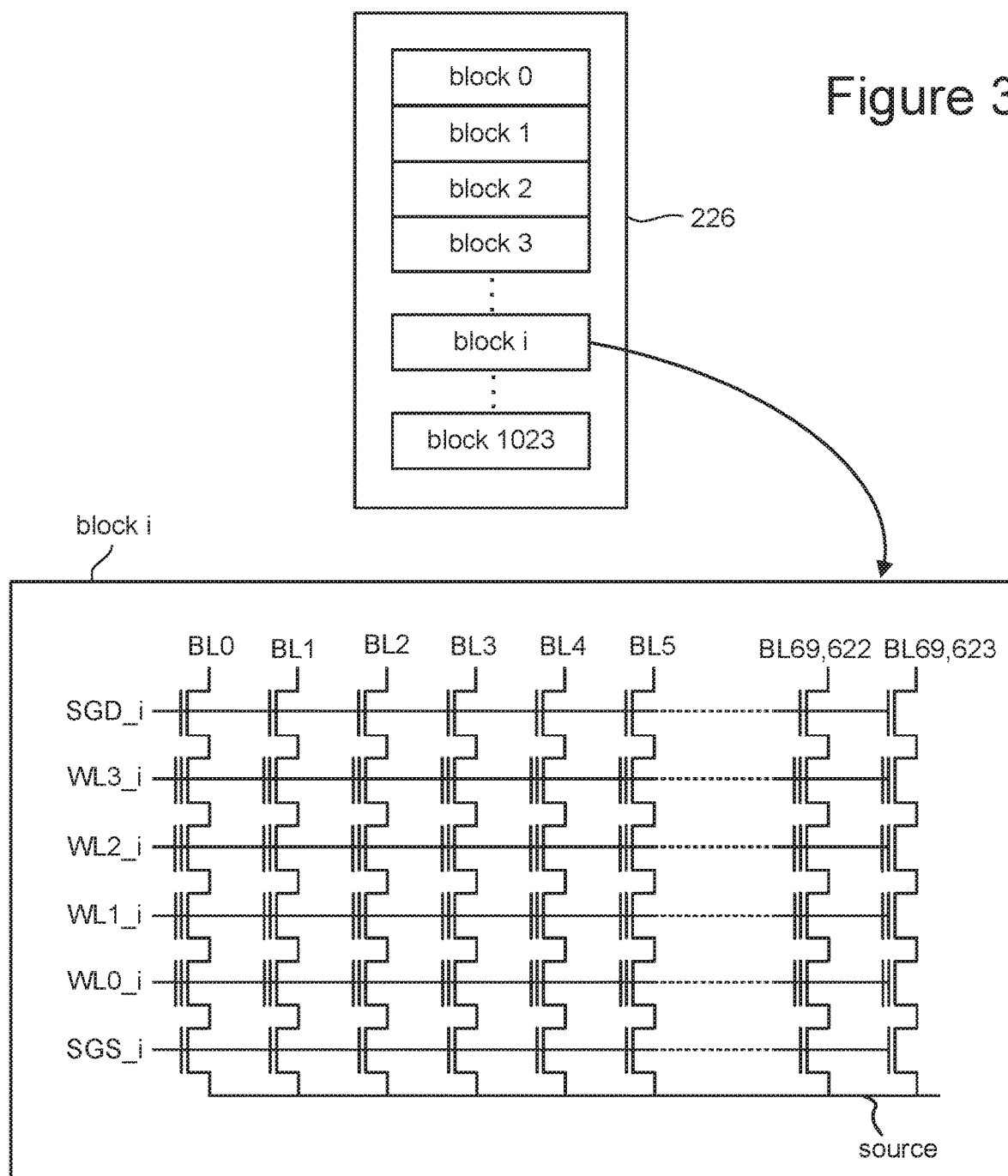
FIG. 3 depicts an example of a structure of memory cell array to illustrate an arrangement of memory cells along word lines and bit line.

FIG. 3 depicts an example of a structure of memory cell array 226 to illustrate an arrangement of memory cells along word lines and bit line. The example of FIG. 3 is for flash NAND type of memory, which can be either a two-dimensional or three-dimensional architecture. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69, 623) and word lines (WL0, WL1, WL2, WL3). FIG. 3 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming and a unit of reading, where the read page and the write page are often taken to be of the same size, different pages sizes can be used for the different operations. Other units of programming and reading can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Besides NAND flash memory, other memory technologies and architectures, including PCM, MRAM, and others discussed above, can be used for the for the memory structure 226. Generally, however, they will be arranged along bit lines and word lines and/or other control lines. For any of these structures, when the memory cells are being sensed, this is typically done by considering a voltage level or current level on a memory cell's bit line in response to bias levels applied to the memory cell by the word lines and/or other control lines, where the sensing is performed by the Sense Blocks 250.

Figure 4:
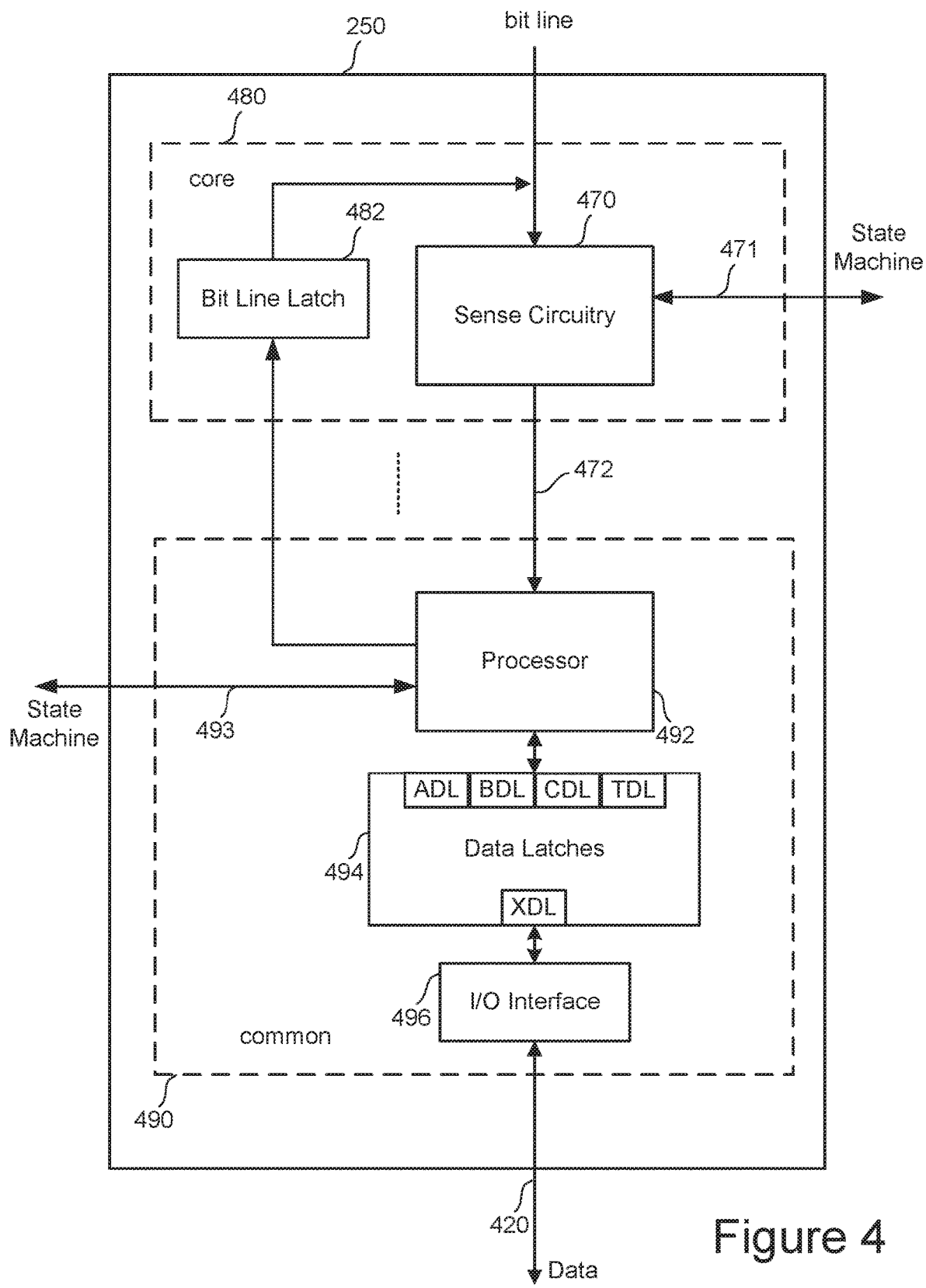
FIG. 4 is a block diagram of an individual sense block partitioned into a core portion and a common portion.

FIG. 4 is a block diagram of an individual sense block 250 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense or sixteen modules 480. Each of the sense modules in a group will communicate with the associated common portion via a data bus 472.

Sense module 480 comprises sense circuitry 470 that determines whether a conduction current in a connected bit line is above or below a predetermined level or, in voltage based sensing, whether a voltage level in a connected bit line is above or below a predetermined level. The sense circuitry 470 is to received control signals from the state machine via input lines 471. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 212 that controls (using power control 216) the supply of different control gate or other bias voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

Data latch stack 494 contains a stack of data latches corresponding to the sense module. In one embodiment, there are three, four or another number of data latches per sense module 480. In one embodiment, the latches are each one bit. In this document, the latches in one embodiment of data latch stack 494 will be referred to as XDL, ADL, BDL, and CDL. In the embodiments discussed here, the latch XDL is a transfer latch used to exchange data with the I/O interface 496. The latches ADL, BDL and CDL can be used to hold multi-state data, where the number of such latches typically reflects the number of bits stored in a memory cell. For example, in 3-bit per cell multi-level cell (MLC) memory format, the three sets of latches ADL, BDL, CDL can be used for upper, middle, lower page data. In 2-bit per cell embodiment, only ADL and BDL might be used, while a 4-bit per cell MLC embodiment might include a further set of DDL latches. The following discussion will mainly focus on a 3-bit per cell embodiment, as this can illustrate the main features but not get overly complicated, but the discussion can also be applied to embodiments with more or fewer bit per cell formats. Some embodiments many also include additional latches for particular functions, such as represented by the TDL latch where, for example, this could be used in "quick pass write" operations where it is used in program operations for when a memory cell is approaching its target state and is partially inhibited to slow its programming rate. In embodiments discussed below, the latches ADL, BDL, . . . can transfer data between themselves and the bit line latch 482 and with the transfer latch XDL, but not directly with the I/O interface 496, so that a transfer from these latches to the I/O interface is transferred by way of the XDL latches.

For example, in some embodiments data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In other embodiments, as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL, and similarly for BDL and CDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 5:
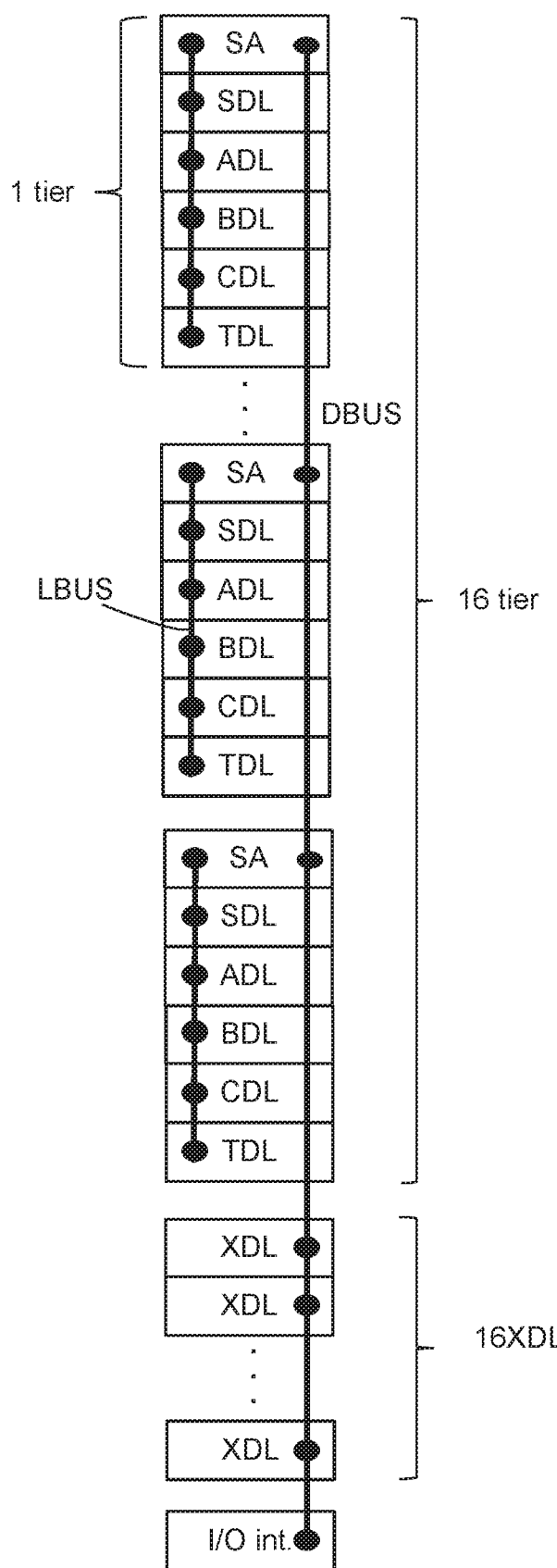
FIG. 5 is a schematic representation of one embodiment for the structure of the data latches.

FIG. 5 is a schematic representation of the structure for one embodiment of the data latches. The example of FIG. 5 is for a 3 bit per cell embodiment where each sense amplifier (SA) has a set of associated data latches forming a "tier" including a sense amp data latch (SDL), the data latches for the 3 bit data states (ADL, BDL, CDL), and an auxiliary data latch (TDL) that could be used for implemented quick pass write operations, for example. Within each of these stacks of data latches, data can be transferred between the sense amplifier and its associated set of latches along a local bus LBUS. In some embodiments, each of the sense amplifiers and corresponding set of data latches of a tier that are associated with one bit line can be grouped together for a corresponding "column" of bit lines, and formed on a memory die within the pitch of the column of memory cells along the periphery of the memory cell array. The example discussed here uses an embodiment where 16 bit lines form a column so that a 16-bit word is physical located together in the array. An example of a memory array may have a 1000 such columns, corresponding to 16K bit lines. Each sense amplifier and its set of associated data latches of a tier are connected along an internal bus structure of DBUSs along which data can be transferred between each of the tier of latches and a corresponding XDL. For the embodiment described in the following, the XDL transfer latches can transfer data to and from the I/O interface, but the other data latches of the tier (e.g., ADL) are not arranged to transfer data directly to or from the I/O interface and must go through the intermediary of the transfer data latch XDL.

FIG. 6 illustrates the layout of the bit lines and sense amplifiers into columns in a schematic representation for two columns of 16 bit lines each. Each of column 0 and column 1 include bit lines BL0-BL15, so that a 16 bit word is grouped together on adjacent bit lines. Each bit line is connected to a corresponding one of sense amplifiers SA0-SA15. As the width of a sense amplifier circuit and the data latches is wider that the pitch of a bit line, rather than be aligned as in the schematic representation of FIG. 6 in the width of single bit line, the sense amps can be placed within the width of the column. In the embodiment shown, the sense amps are grouped into a set of 8 sense amplifiers corresponding to a lower half column storing a lower half word of data (e.g., L0 for column 0) for each page and a set of 8 set amplifiers corresponding to an upper half column storing an upper half word of data (e.g., H0 for column 0) for each page, where these can then be interleaved as shown in FIG. 6. Each half column of sense amplifiers is connected to a corresponding I/O interface 100-107 for the lower and upper half column. For example, on the left of FIG. 6 column L0 corresponds to the odd bit lines connected to SA0-SA7 through a first set of 100-107; and L1 corresponds to the even bit lines connected to SA8-SA15 through a second set of 100-107. The structure represented schematically in FIG. 6 would be repeated, for example, 16,000 times for the whole an array.

Figure 7:
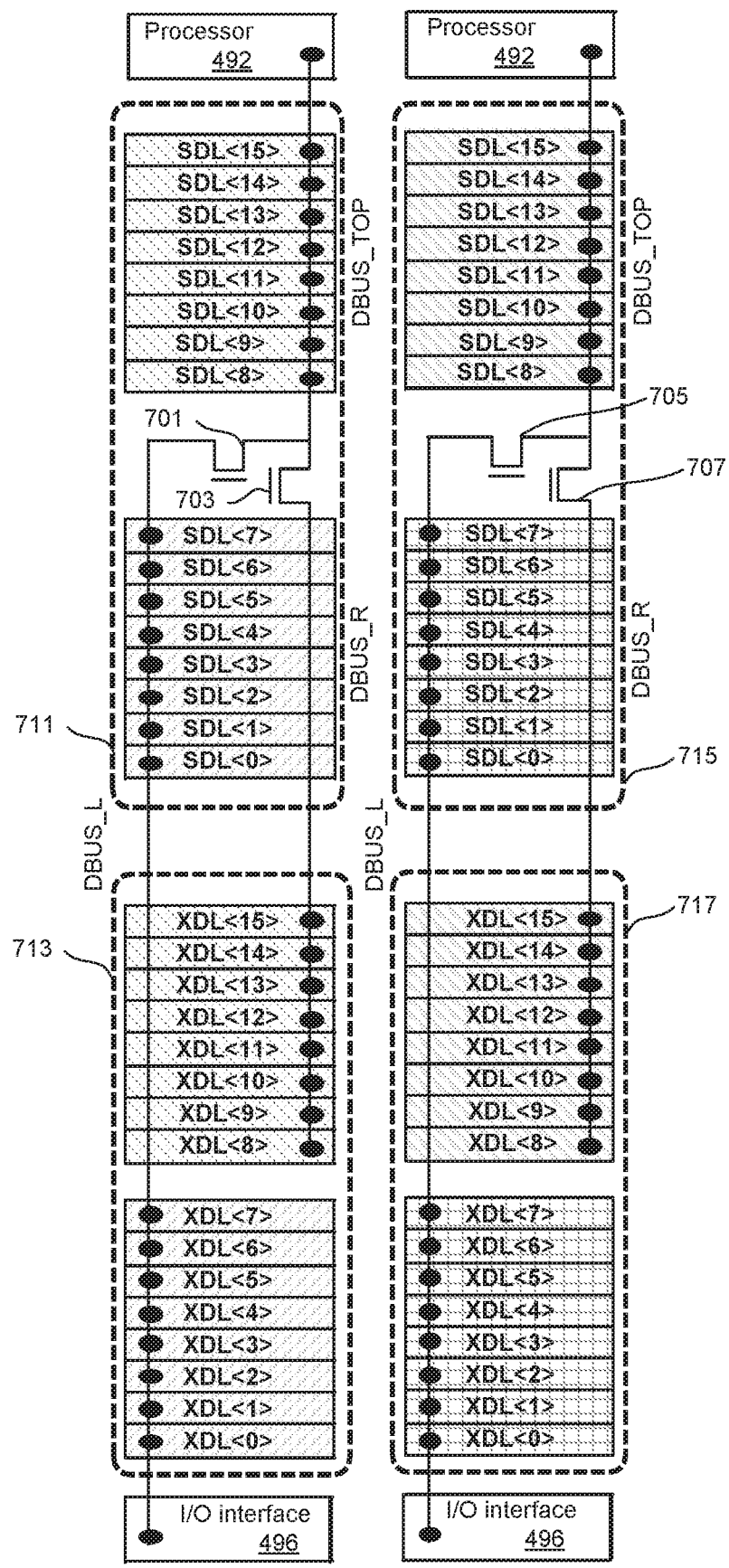
FIG. 7 shows more detail on an arrangement of the data latches for an embodiment where the column is split into an upper and a lower half-column as represented in FIG. 6.

FIG. 7 shows more detail on an arrangement of the data latches 494 of FIG. 4 for an embodiment where the column is split into an upper and a lower half-column as represented in FIG. 6 for the two columns of FIG. 6. In FIG. 6, for each bit line only the latch SDL is shown for a tier in order to simplify the figure, but for each shown SDL the other data latches (ADL, BDL, CDL, TDL) and sense amplifier of each bit line of the tier will also connected on the local bus LBUS, so that if all of these were explicitly represented there would a corresponding increase in the number of latches on each column.

The data latches 494 of column 0 are connected to the processor 492 by a the bus DBUS_TOP to the SDL latches SDL<0>-SDL<15>711 (including the not explicitly represented latches ADL, BDL, CDL, TDL) for both the upper half-page H0 for sense amplifiers SA8-SA15 and the lower half-page L0 for sense amplifiers SA0-SA7. The other columns, as illustrated to the right for column 1, are similarly arranged. A switch 701 allows DBUS_TOP to connect to a connect to a left data bus DBUS_L and a switch 703 allows DBUS_TOP to connect to a connect to a right data bus DBUS_R. In the embodiment of FIG. 7, the upper half columns latches SDL<8>-SDL<15> are connected to processor 492 along DBUS_TOP, while to connect the processor 492 to the lower half columns latches SDL<0>-SDL<7> the switch 701 is turned on and 703 is turned off, allowing data to be transferred between these lower half columns latches SDL<0>-SDL<7> to be transferred to and from the sense amplifier.

In the column 0 transfer latches 713, the transfer latches XDL<8>-XDL<15> are connected to the SDL<8>-SDL<15> over the DBUS H by switch 703 to allow transfer between these latches. The transfer latches XDL<0>-XDL<7> are connected to the SDL<0>-SDL<7> over the DBUS_L, that is also connected on to the I/O interface to allow transfers to and from the outer bus that is for the e interface to a host. For column 1, the transfer latches 717 and sense amp tier latches 715 are arranged similarly through switches 705 and 707.

An important factor for a memory device is read and write performance. One of the factors that contribute to the amount of time required for a read or write operation is the time consumed by data transfer into and out of the data latch structures and the shuffling of data within the latches. For example, in column 0 after sensing the selected memory cells on bit lines BL0-BL15 of column 1, the lower half page L0 is transferred over DBUS_TOP though switches 701 and, 703 and latched in SDL<0>-SDL<7> of column 0 data latches 711, and then the upper half page H0 is transferred over DBUS_TOP and latched in SDL<8>-SDL<15> of column 0 data latches 711. From the SDL latches 711, the read data is transferred to the XDL latches 713, with SDL<0>-SDL<7> transferred over DBUS_L to XDL<0>-XDL<7> and with SDL<8>-SDL<15> transferred over DBUS H to XDL<8>-XDL<15>. From the XDL latches 713, the data from L0 is first transferred out over DBUS_L from XD<0>-XDL<7> to the I/O interface 496 and then on to the controller 102, after which the data from H0 is first transferred from XD<8>-XDL<15> out along DBUS_R, through switches 701 and 703, and then over DBUS_L to the I/O interface 496 and then on to the controller 102. This process is similarly performed in column 1, as well as other odd and even columns selected for a read operation.

In a programming process, the write data is transferred in over the I/O interface 496 and mover through the XDL latches 713 and SDL latches 711 in the reverse order before being programmed into the memory cells along the bit lines of column 0 and other write selected columns.

Both read and write performance could be improved if these data cache transfers could be more efficiently performed. As any area on the memory data devoted to peripheral elements, such as the data latches structures, is area not available for the storage of user data, if an increase in the number latches, size of the latches, or increase in the bus sizes can be avoided or minimized, this allows for the storage capacity to be maintained.

Referring back to FIGS. 6 and 7, the bit lines of a column are grouped together as a contiguous set of bit lines. The bit lines of the columns are broken in to two groups, each of 8 bit lines and storing either an upper (H0 or H1) or lower half word (L0 or L1) of data (for each bit of a multi-level memory cell on a selected word line, or page of data), where the bit lines of the two half pages are interleaved in the memory array. (Although more generally applicable, the example of FIGS. 6 and 7 and the following discussion are based on a column of 16 bit lines and a data word of 16 bits.) This interleaving of the half columns allows for the sense amplifiers of each half column (e.g., SDL<0>-SDL<7> for BL0-BL7, and SDL<8>-SDL<15> for BL8-BL15 can be grouped together within the pitch of the whole column. Although this places all of the data latches (711 for column 0, 715 for column 1) and transfer latches (713 for column 1, 717 for column 1) within the pitch of the corresponding column, the sets of latches of a column are separated into two groups that are connected over the bus structure formed of DBUS_TOP, DBUS_L and DBUS_R. When transferring data in the internal latch structures between the SDL latches (711 or 715), the XDL latches (713 or 717), and the I/O interfaces 496 of each common portion 490 a half word at a time as these busses are a half word wide. Because of this, only a half a logic word of data of each word is transferred out to the data bus 420 at a time. To improve upon this arrangement, FIGS. 8 and 9 illustrate an embodiment that allows for faster data cache transfers, with little area penalty.

Figure 8:
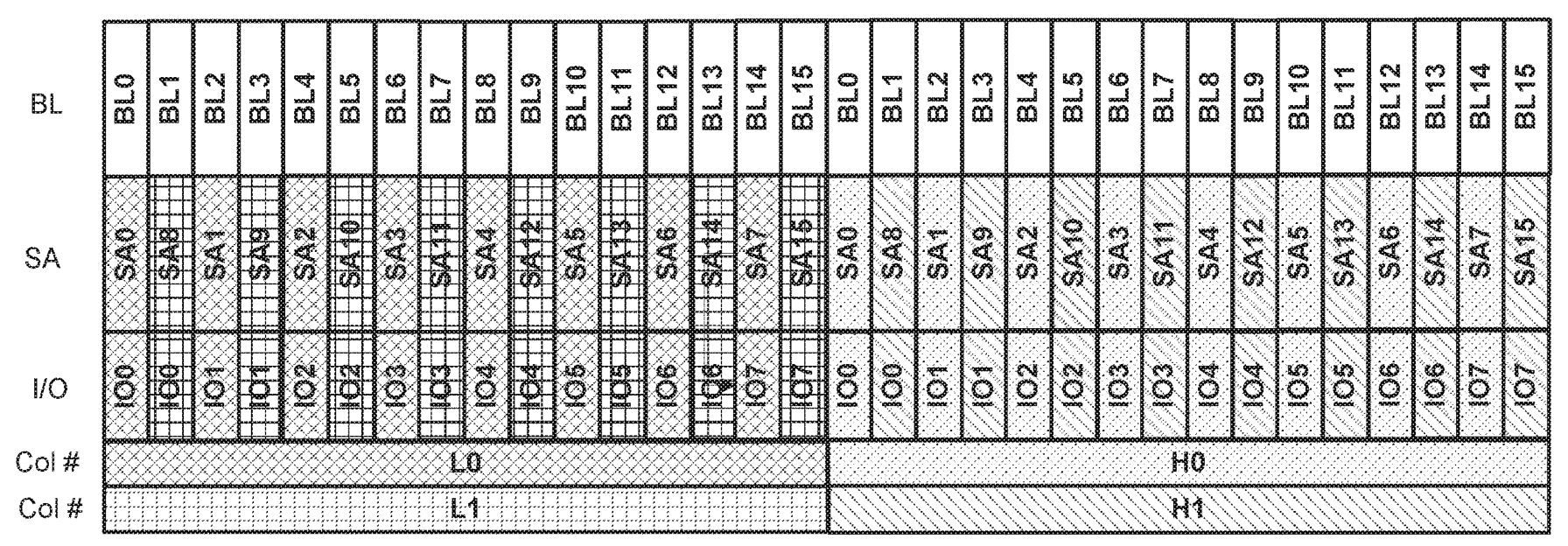

More specifically, FIG. 8 is a schematic illustration of an embodiment for a memory array where half logic words from different whole logic words are interleaved within a single column. Relative to FIG. 6, rather than have all of the partial logic words of a single logic word stored in the same column, partial logic words from different logic word are stored in the same column. The example of FIG. 8 shows a column having a logic word split into two half logic words and where the two columns storing the two half words of each full logic word are stored in adjacent columns, but, more generally, a logic word can be split into a larger number of partial words stored on more columns (e.g. four quarter words spread over four columns) and the different partial code words need not be stored on adjacent columns.

In the embodiment of FIG. 8, the lower half code word L0 is interleaved with the lower half code word L1 in the column represented to the left, and the upper half code word H0 is interleaved with the upper half code word H1 in the column represented to the right. The sense amplifiers and data latches associated with a column are aligned with the column, so that for the left column the latches will have the lower half words transferred through them and that for the right column the latches will have the upper half words transferred through them. This is illustrated in FIG. 9.

Figure 9:
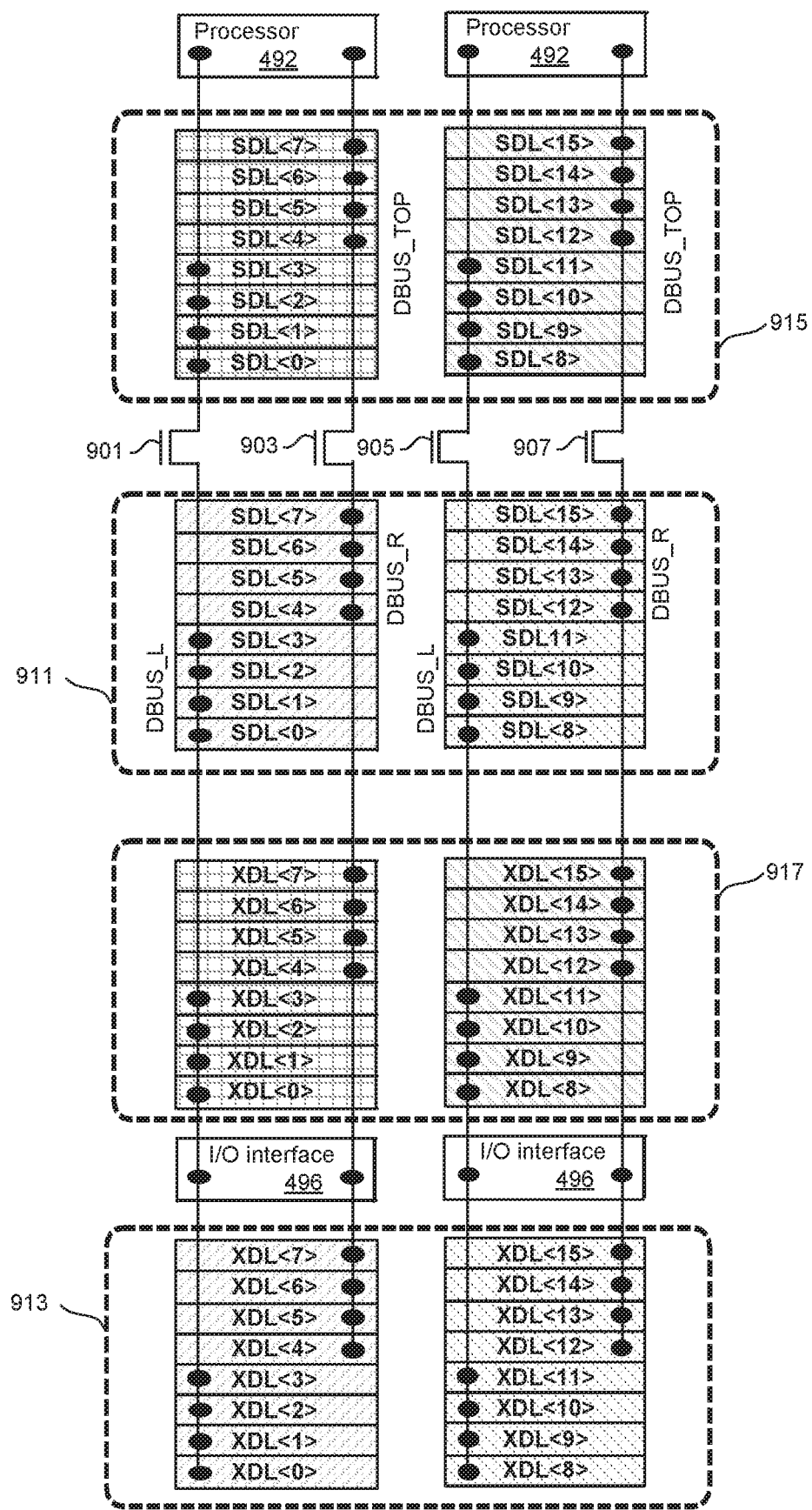
FIG. 9 illustrates an embodiment for the arrangement of the data latches to support the columns storing partial logic words from different full logic words as represented in FIG. 8.

FIG. 9 illustrates an embodiment for the arrangement of the data latches to support the columns storing partial logic words from different full logic words as represented in FIG. 8. Relative to FIG. 7, the data latches 911 for storing logic word 0 and the data latches 915 for storing logic word 1 now have half of their latches aligned with the corresponding two columns holding these half logic words. (In this example, where two 8-bit half logic words are interleaved in each column, half of the data latches for storing a logic word are aligned with each column.)

In the representation of FIG. 9, 915 is shown at top with data latches SDL<0>-SDL<7> under the left column for storing L1 and latches SDL<8>-SDL<15> under the left column for storing H1. Below the L1, H1 data latches 915 are shown the data latches 911 with data latches SDL<0>-SDL<7> under the left column for storing L0 and latches SDL<8>-SDL<15> under the left column for storing H0, where the relative placement of the data latches 911 and 915 can be swapped, depending on the embodiment.

The sets of transfer latches corresponding to the sets of data latches are similarly arranged, with the transfer latches 913 with transfer latches XDL<0>-XDL<7> under the left column for transferring L0 and transfer latches XDL<8>-XDL<15> under the left column for transferring H0. Similarly, the transfer latches 917 with transfer latches XDL<0>-XDL<7> under the left column for transferring L1 and transfer latches XDL<8>-XDL<15> under the left column for transferring H1.

To facilitate the transfers of data between the sense amplifiers, sets of latches, and the I/O interfaces, the internal bus structure is also changed relative to the embodiment of FIG. 7. Rather than a single 8-bit wide (in this example 16 bit logic word and column width example) data bus structure DBUS_TOP as a pair of 8-bit data busses DBUS_L and DBUS_R as in FIG. 7, a pair of 4-bit wide data busses DBUS_L and DBUS_R span all the sets of latches 911, 913, 915, and 917 and connect these to the I/O interface 496. Each of these sense block data busses includes a set of switches 901, 903 and 905, 907 between the sets of data latch blocks 915 and 911 allowing data to be selectively transferred into either 911 for logic word 0 and logic word 915 for logic word 1.

Relative to the embodiment of FIG. 7, the arrangement of the latches and the 4 data bus structure in FIG. 9 allow for a full logic word to be transferred out together. Based on this arrangement, half of the data content of the array (e.g., 8K bit lines of a 16K array) can be transferred between the XDL transfer latches and the I/O interface 496 at a time, during which the other half of the data content can be transferred between the SDL latches and XDL latches. This allows for the time used for the SDL-XDL transfers to be hidden behind the XDL-I/O interface transfers, improving performance.

A column of a memory device can be defective for a number of reasons, including defective memory cells along the columns bit lines, shorts or breaks in the bit lines, and defects in peripheral circuitry (such as sense amplifiers or data latches) associated with the column. Such defects can be due to processing and be present when a device is fresh or arise during operation of the device, both due to weaknesses in a fresh device and due to wear over the life of a device. To be able to manage such defects, a memory device will often include redundant columns, not accounted for in the available space for user data, but which can be substituted in to replace bad columns. For example, if a memory device has a user data capacity 16K columns, which will correspond to the amount of logical memory space as seen be a host device, the memory device will also have some amount of space for error correction code (ECC) associated with the user data and also some amount of space for redundant columns (CRD), so the actual size of the memory is 16K+CRD+ECC.

Figure 10B:
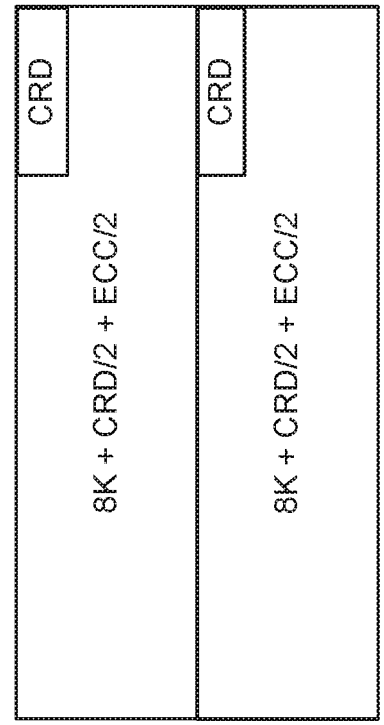
FIG. 10B is a logical image of the memory space of a memory device with the column redundancy portion split between two halves of the logical image.
Figure 10A:
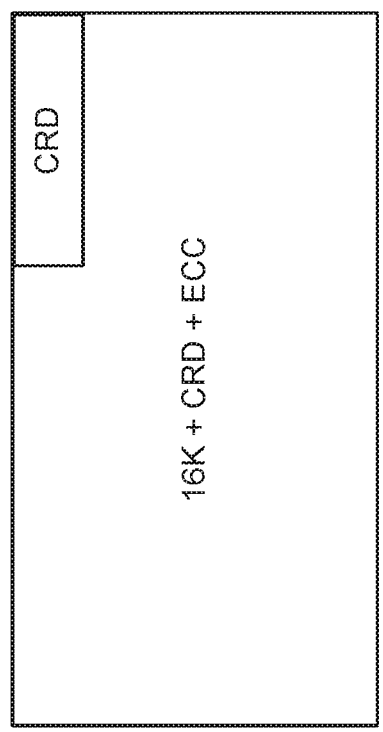
FIG. 10A is a logical image of the memory space, including the column redundancy portion, of a memory device.

FIG. 10A is a logical image of the memory space, including the column redundancy (CRD) portion, of a memory device, again for the example with a user data capacity of 16K columns. As any columns set aside for the CRD portion are lost capacity for user data, the size of the CRD portion is a design decision based a trade-off between user capacity and device resilience. As illustrated schematically, the CRD columns will available for replacing bad columns across the whole of the array. When a logic word is split between multiple columns, as in the embodiment described above with respect to FIGS. 8 and 9, only one of the logic word split between a pair (in the example of FIGS. 8 and 9) is transferred out at a time. Consequently, only half the data space represented in FIG. 10A is available to be transferred in or out of the latch structures at a time. Because of this, if the CRD columns are located in just one half of the columns, they may not be readily available to replace bad columns in the other half. To account for this, FIG. 10B illustrates the use of embodiments where the CRD area is split, with a portion in each half of the memory space.

FIG. 10B is a schematic representation of the logical image of the memory space of a memory device with the column redundancy portion split between two halves of the logical image, with each half of the memory space (i.e., even columns, odd columns) receiving half of the CRD allotment. By restricting half of the CRD to half the memory space, any replacement columns will fall within the same half-space boundary as the columns that they replace. If the size of CRD is marginal, the CRD size may be increased in case a memory is prone to clustering of bad columns; but in many memory devices, defective columns tend to be fairly uniformly distributed across the device and the CRD size will not need to increase.

Returning now to the transfer of data between the SDL latches the XDL latches, FIGS. 11A-11C and 12A-12C repeat the elements of FIG. 9 and respectively illustrate the transfer between the SDL latches and the XDL latches for a read operation and a write operation. In the read process of FIGS. 11A-11C, the sensing of selected memory cells along the bit lines has already been performed and the results latched in the data latches 911 for logic word 0 and in the data latches 915 for logic 1. Although only a pair of columns are shown, the process can be performed concurrently across the memory array.

Figure 11A:
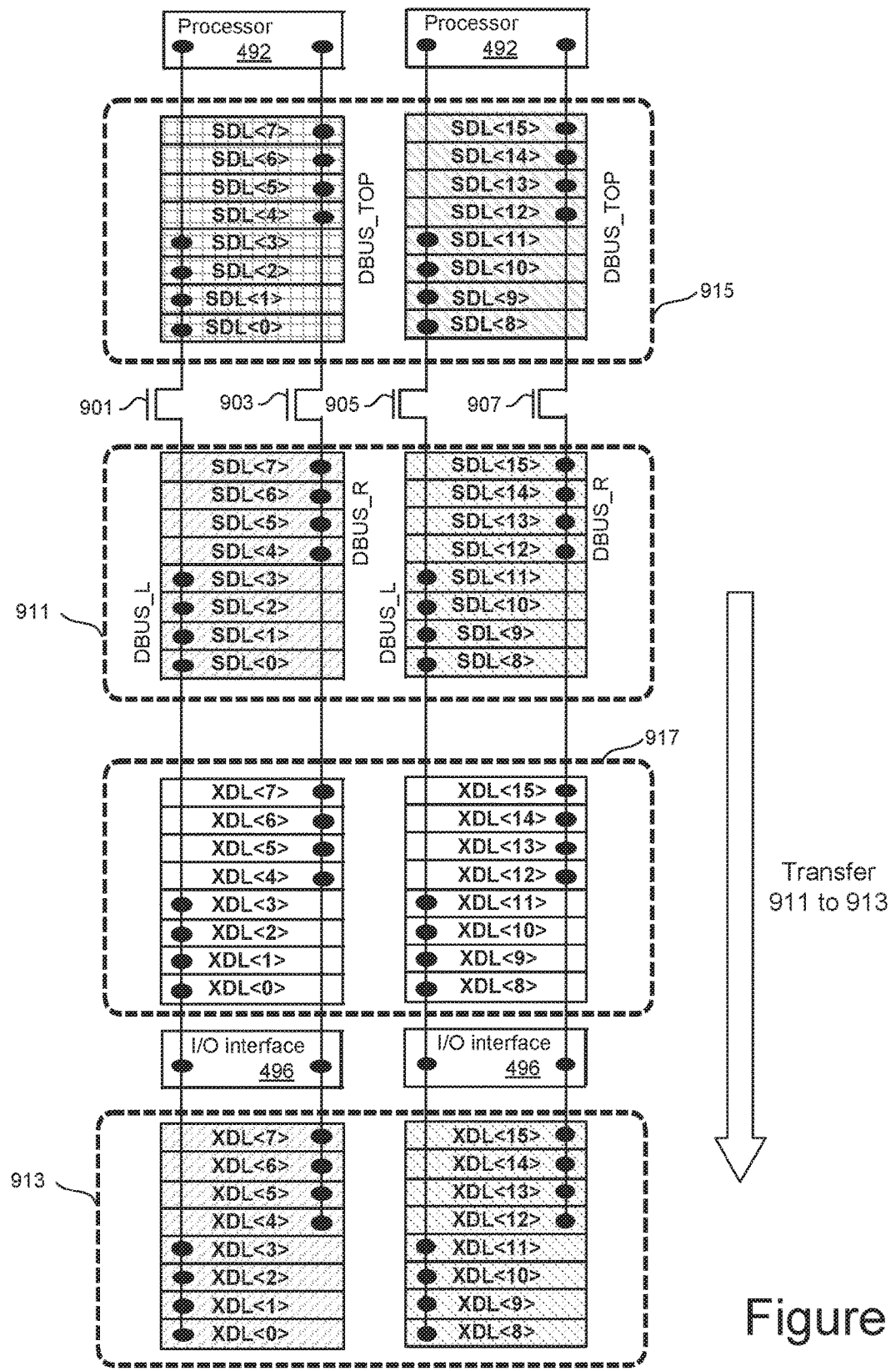
FIGS. 11A-11C and 12A-12C respectively illustrate the transfer between the sense amplifier latches and the shared transfer latches for a read operation and a write operation.

In FIG. 11A, the switches 901, 903, 905 and 907 are turned off, cutting off data latches 915 for logic word 1 from the DBUS_R and DBUS_L. The data stored in SDL<0>-SDL<3> of 911 are transferred to XDL<0>-XDL<3> of 913 over DBUS_L of the left column and the data stored in SDL<4>-SDL<7> of 911 are transferred to XDL<4>-XDL<7> of 913 over DBUS_R of the left column to move the half logic word L0 into the transfer latches. At the same time, the half logic word H0 is moved into the transfer latches: The data stored in SDL<8>-SDL<11> of 911 are transferred to XDL<9>-XDL<11> of 913 over DBUS_L of the right column and the data stored in SDL<12>-SDL<15> of 911 are transferred to XDL<12>-XDL<15> of 913 over DBUS_R of the right column.

Figure 11B:
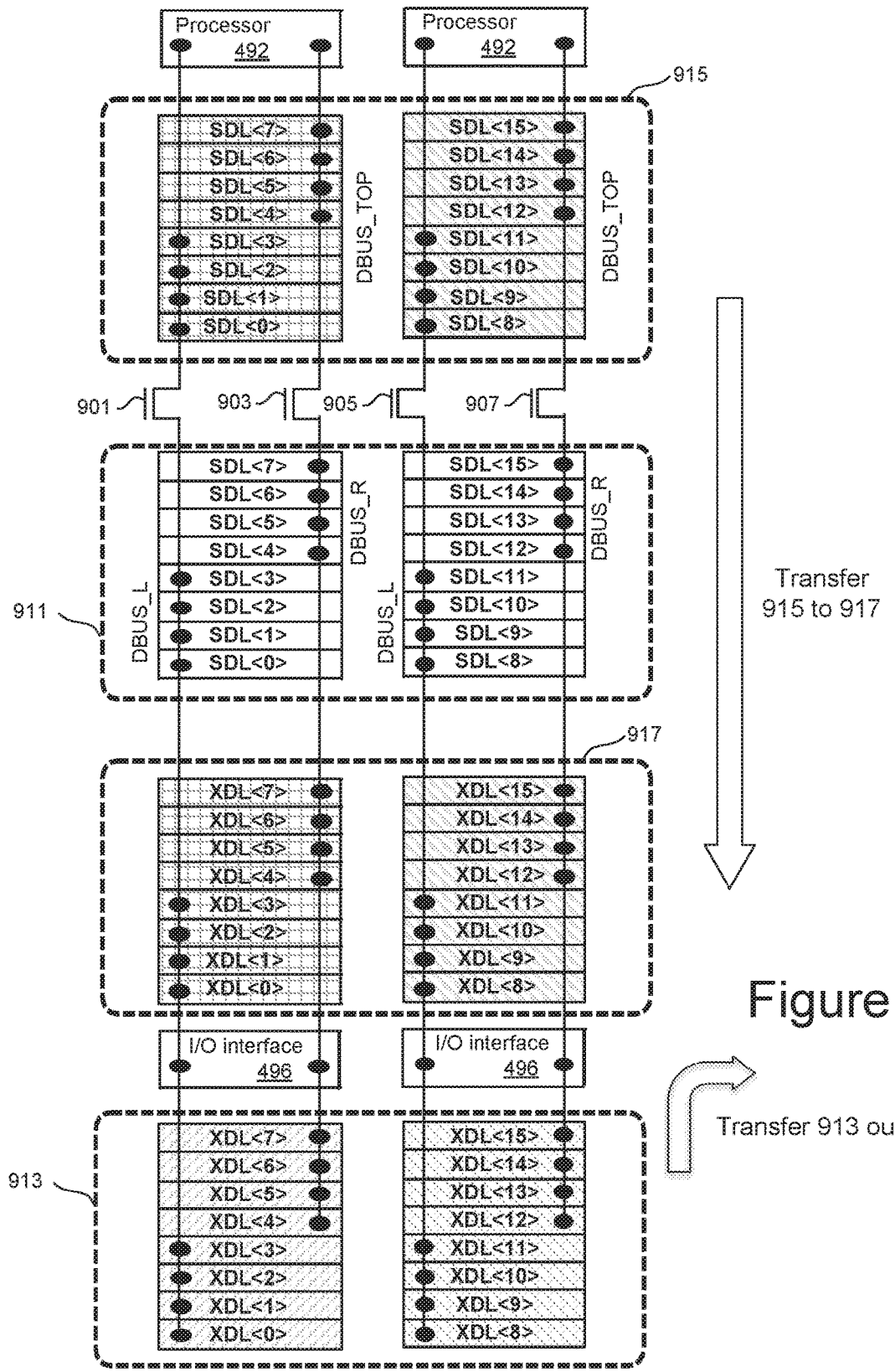

Once the transfer of the first logic word from data latches 911 to transfer latches 913 is done, the logic word 0 is ready to be shifted out over the I/O interfaces 496. As illustrated in FIG. 11B, concurrently with transferring out logic word 0 over the I/O interfaces 496, the switches 901, 903, 905, and 907 are on and the logic word 1 is transferred from the data latches 915 to the transfer latches 917. More specifically, the data stored in SDL<0>-SDL<3> of 915 are transferred to XDL<0>-XDL<3> of 917 over DBUS_L of the left column and the data stored in SDL<4>-SDL<7> of 915 are transferred to XDL<4>-XDL<7> of 917 over DBUS_R of the left column to move the half logic word L1 into the transfer latches. At the same time, the half logic word H1 is moved into the transfer latches, with the data stored in SDL<8>-SDL<11> of 915 are transferred to XDL<9>-XDL<11> of 917 over DBUS_L of the right column and the data stored in SDL<12>-SDL<15> of 915 are transferred to XDL<12>-XDL<15> of 917 over DBUS_R of the right column. As the transfer out of logic word 1 from the data latches 915 to transfer latches 917 is performed during the transfer out of logic word 0, the transfer of logic word 1 to the transfers latches is hidden behind the transfer out of logic word 0.

Figure 11C:
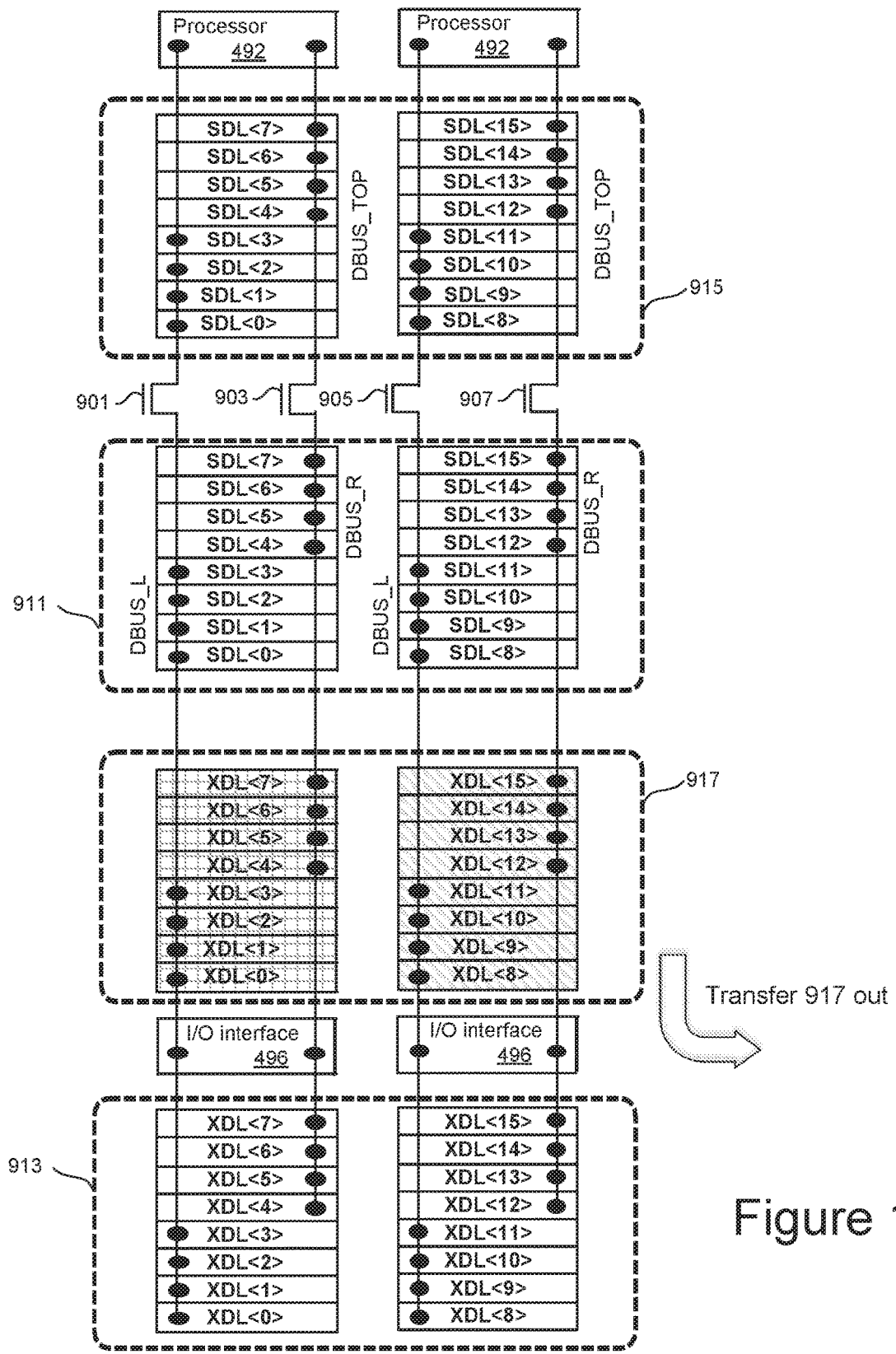

After logic word 0 has been transferred out and logic word 1 transferred over the bus structure to the transfer latches 917, logic word 1 can be transferred over the I/O interfaces 496 to the data bus of the memory circuit. This is represented in FIG. 11C. Once the data of the logic words has been cleared out to the bus, the memory circuit can sense another page of data and load the sensing result into the data latches and repeat the process. In the case of a multi-level memory, the values of the different bits stored in the latches ADL, BDL, . . . can be shifted out either first for all of the bit lines of one set (i.e., those on which logic word 0 was stored) followed by all of the bit lines of one set (i.e., those on which logic word 1 was stored), or the different bits of the two sets can be alternated.

Figure 12A:
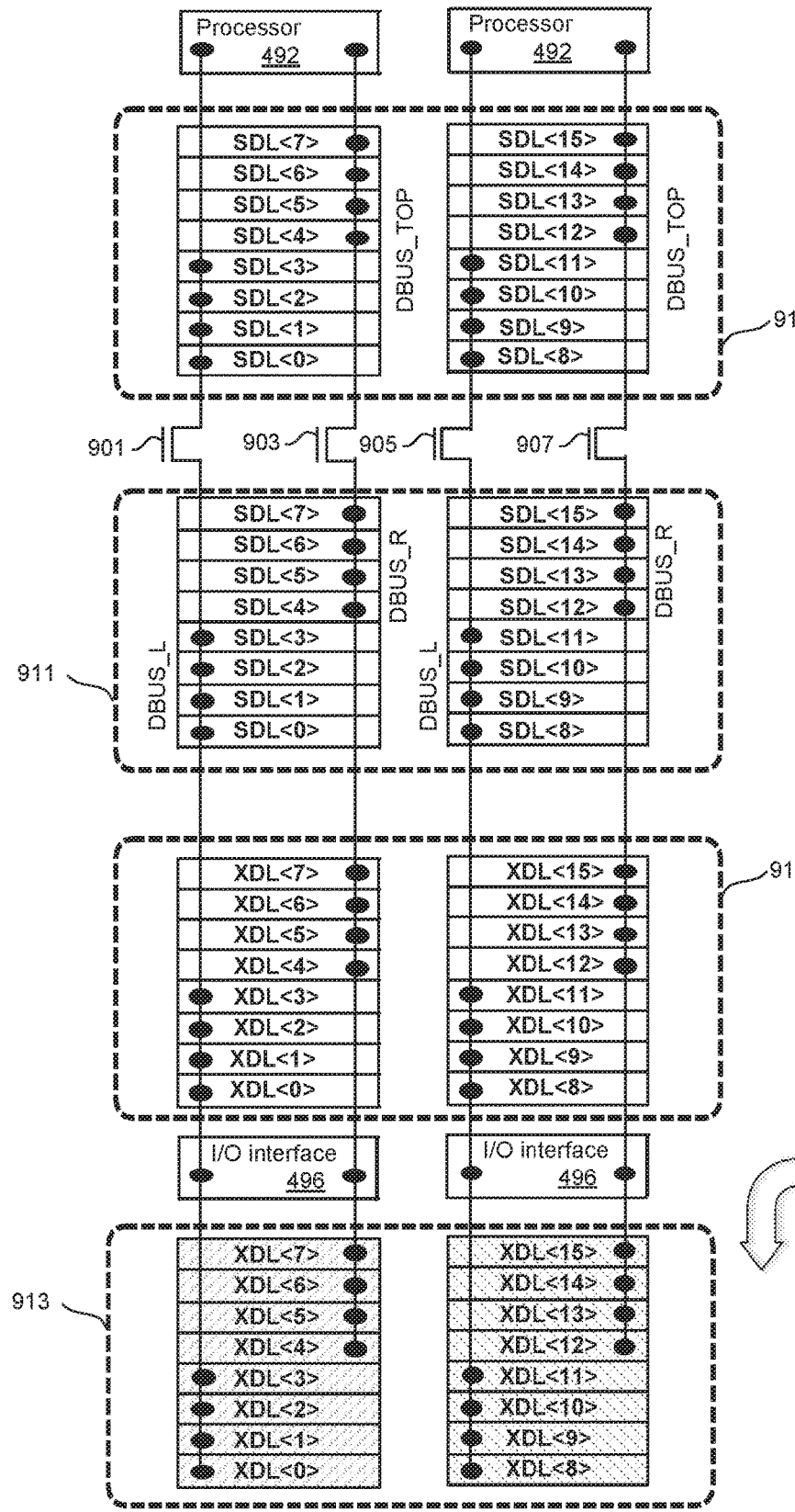
Figure 12B:
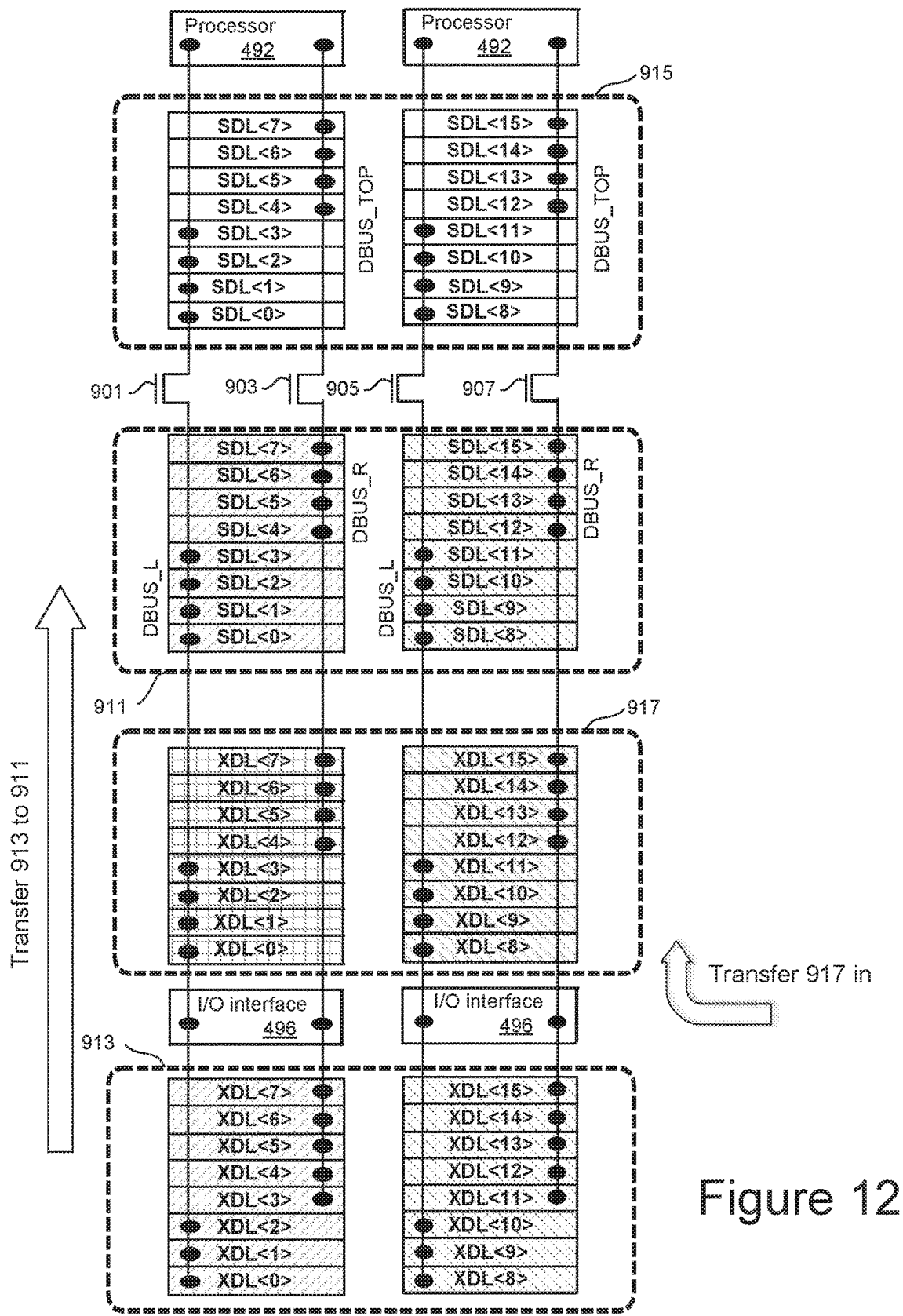
Figure 12C:
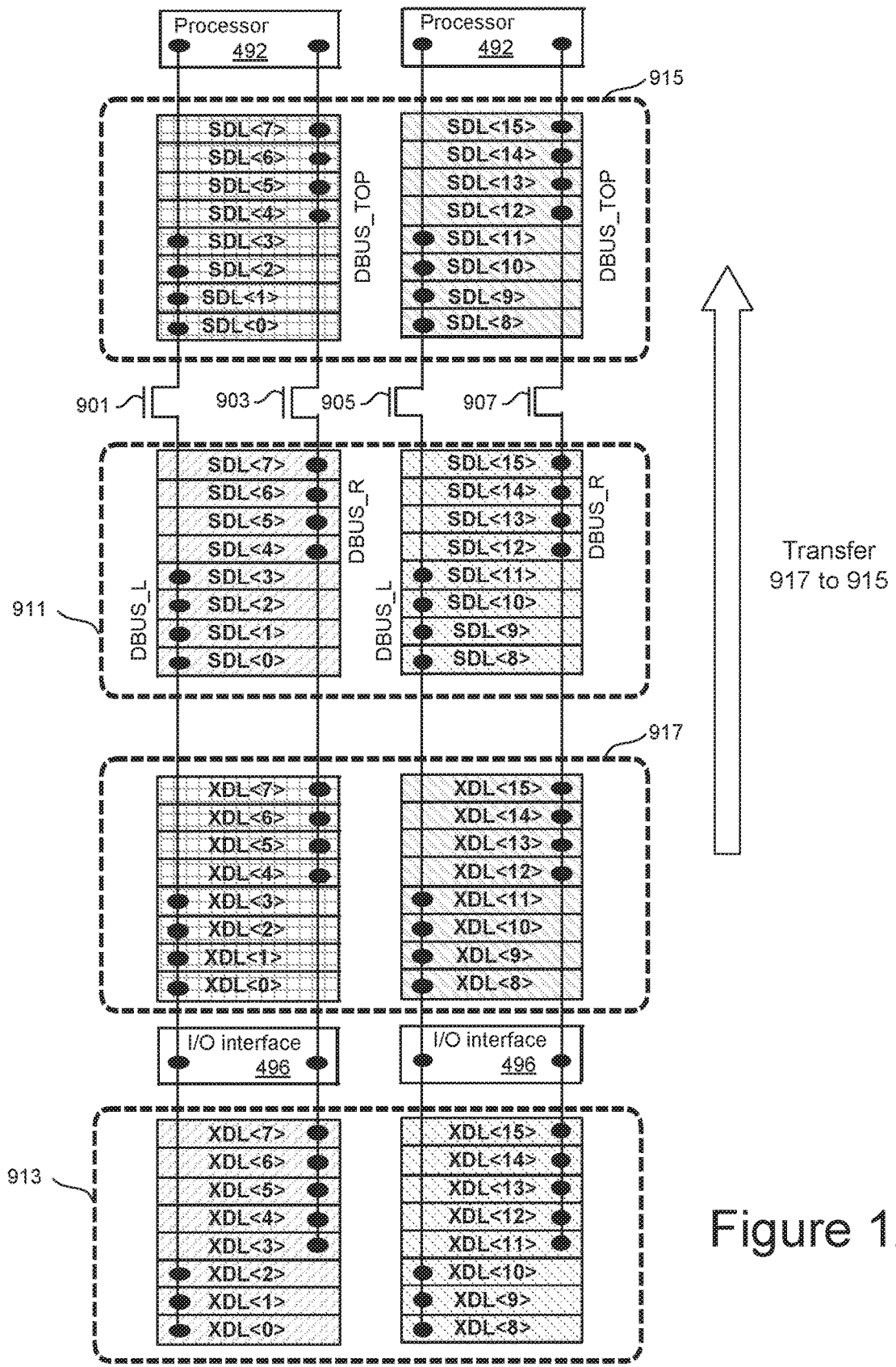

FIGS. 12A-12C illustrate the shifting of data through the latch structures as part of a write process. Beginning with FIG. 12A, a first logic word (logic word 0) is received the I/O interface 496 and loaded into the transfer latches 913 XDL<0>-XDL<15> over DBUS_L of the left column for XDL<0>-XDL<3>, over DBUS_R of the left column for XDL<4>-XDL<7>, over DBUS_L of the right column for XDL<8>-XDL<11>, and over DBUS_R of the right column for XDL<12>-XDL<15>. During the transfers of FIGS. 12A and 12B, the switches 901, 903, 905, and 905 are off as data is not being transferred into logic page 1 data latches 915.

As illustrated in FIG. 12B, the first logic word (logic word 0) is then transferred from the transfer latches 913 to the data latches 911. More specifically, the data stored in XDL<0>-XDL<3> of 913 are transferred to SDL<0>-SDL<3> of 911 over DBUS_L of the left column and the data stored in XDL<4>-XDL<7> of 913 are transferred to SDL<4>-SDL<7> of 911 over DBUS_R of the left column to move the half logic word L0 into the data latches. At the same time, the half logic word H0 is moved into the data latches: The data stored in XDL<9>-XDL<11> of 913 are transferred to SDL<8>-SDL<11> of 911 over DBUS_L of the right column and the data stored in XDL<12>-XDL<15> of 913 are transferred to SDL<12>-SDL<15> of 911 over DBUS_R of the right column. At the same logic word 0 is moved in the data latches 911, a second logic word (logic word 1) is received the I/O interface 496 and loaded into the transfer latches 917 XDL<0>-XDL<15> over DBUS_L of the left column for XDL<0>-XDL<3>, over DBUS_R of the left column for XDL<4>-XDL<7>, over DBUS_L of the right column for XDL<8>-XDL<11>, and over DBUS_R of the right column for XDL<12>-XDL<15>.

Subsequently, as illustrated in FIG. 12C, the switches 901, 903, 905, and 905 are turned on to connect the set of data latches 915 to the set of transfer latches 917 and the second logic word (logic word 1) is moved to the data latches 915. More specifically, the data stored in XDL<0>-XDL<3> of 917 are transferred to SDL<0>-SDL<3> of 915 over DBUS_L of the left column and the data stored in XDL<4>-XDL<7> of 917 are transferred to SDL<4>-SDL<7> of 915 over DBUS_R of the left column to move the half logic word L1 into the data latches. At the same time, the half logic word H1 is moved into the data latches: The data stored in XDL<9>-XDL<11> of 917 are transferred to SDL<8>-SDL<11> of 915 over DBUS_L of the right column and the data stored in XDL<12>-XDL<15> of 917 are transferred to SDL<12>-SDL<15> of 915 over DBUS_R of the right column.

Once the write data for the two logic words are latched into the data latches 911 and 915, a program operation can be performed to write the latched data into the selected memory cells along the corresponding bit lines. In the case of a multi-level memory performing a multi-level program operation, the values of the different bits stored in the latches ADL, BDL, . . . can be shifted in either first for all of the bit lines of one set (i.e., those on which logic word 0 was stored) followed by all of the bit lines of one set (i.e., those on which logic word 1 was stored), or the different bits of the two sets can be alternated.

Figure 13:
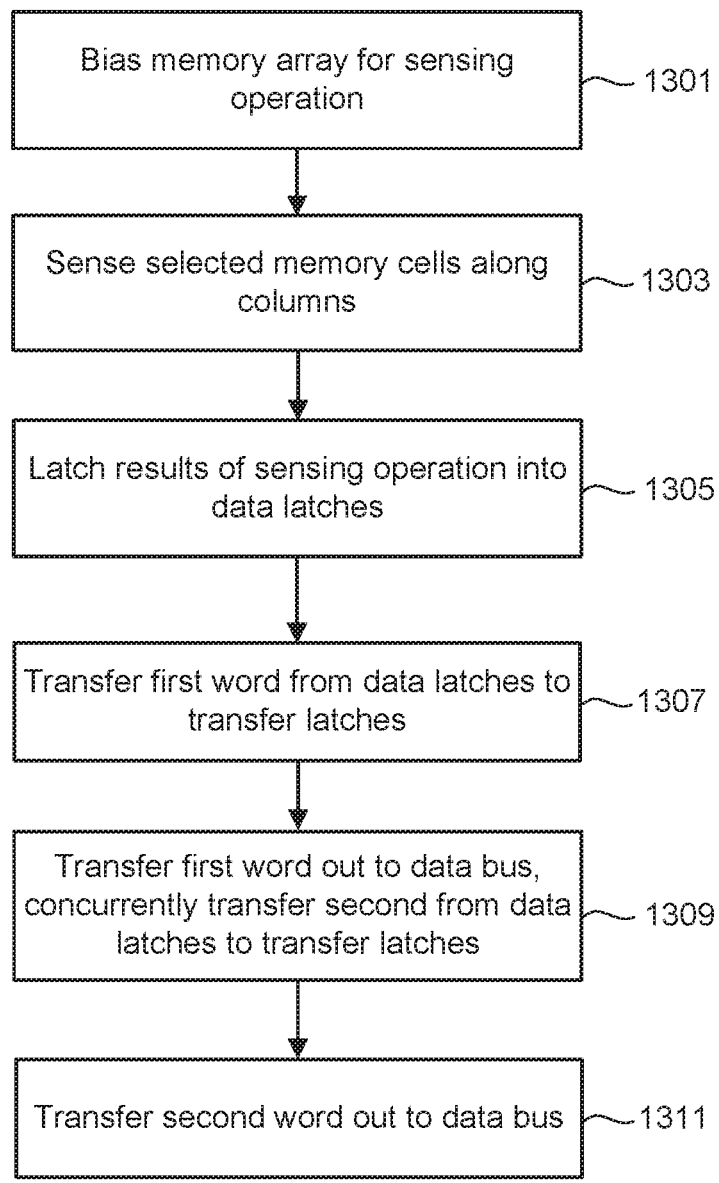
FIG. 13 is a flowchart of one embodiment for a read process using the structure of FIGS. 8 and 9.

FIG. 13 is a flowchart of one embodiment for a read process using the data latch structure of FIGS. 9 and 10, where reference is made to the processes illustrated by FIGS. 11A-11C. At step 1301 the memory array or structure 226 is biased for a read operation of selected memory cells. Typically, the selected memory cells will correspond to a selected word line in the array. The selected memory cells are sensed at step 1303 by the sense circuits 470, with the results latched in the data latches 911 and 915 at step 1305, which is the condition of the latches at the beginning of the process illustrated in FIG. 11A.

As described above with FIGS. 11A-11C, logic word 0 is transferred out prior to transferring out of logic word 1, although the order can be reversed. The flow of FIG. 13 uses the same order as in FIGS. 11A-11C. At step 1307, logic word 0 is transferred from the set of data latches 911 to set of transfer latches 913 as described above with respect to FIG. 11A. Step 1309 corresponds to the process illustrated in FIG. 11B, where the first logic word is transferred out of the transfer latches 913 over the I/O interface 496 to the memory chip's data bus, while concurrently transferring the second data word from the data latches 915 to the transfer latches 917. At step 1311, the second logic word is transferred out of the transfer latches 917 over the I/O interface 496 to the memory chip's data bus, as illustrated by FIG. 11C.

In terms of timing for a read process using the structure of FIGS. 6 and 7 relative to the structures of FIGS. 8 and 9 as described with respect to FIGS. 11A-11C and 13, the time required to move out the data from the transfer latches 713 and 717 in FIG. 7 is the same as required to move out the data from the transfer latches 913 and 917 in FIG. 9. With respect to the SDL to XDL transfers, although time for the SDL 911 to XDL 913 transfer of FIG. 11A and step 1307 will still be part of the read time, the time for the SDL 915 to XDL 917 transfer is hidden behind the concurrent transfer out the first logic word, as illustrated at FIG. 11B and step 1309. Under the arrangement of FIG. 7, both the SDL 711 to XDL 713 transfer and the SDL 715 to XDL 717 transfer would have individually contributed to the read time.

Figure 14:
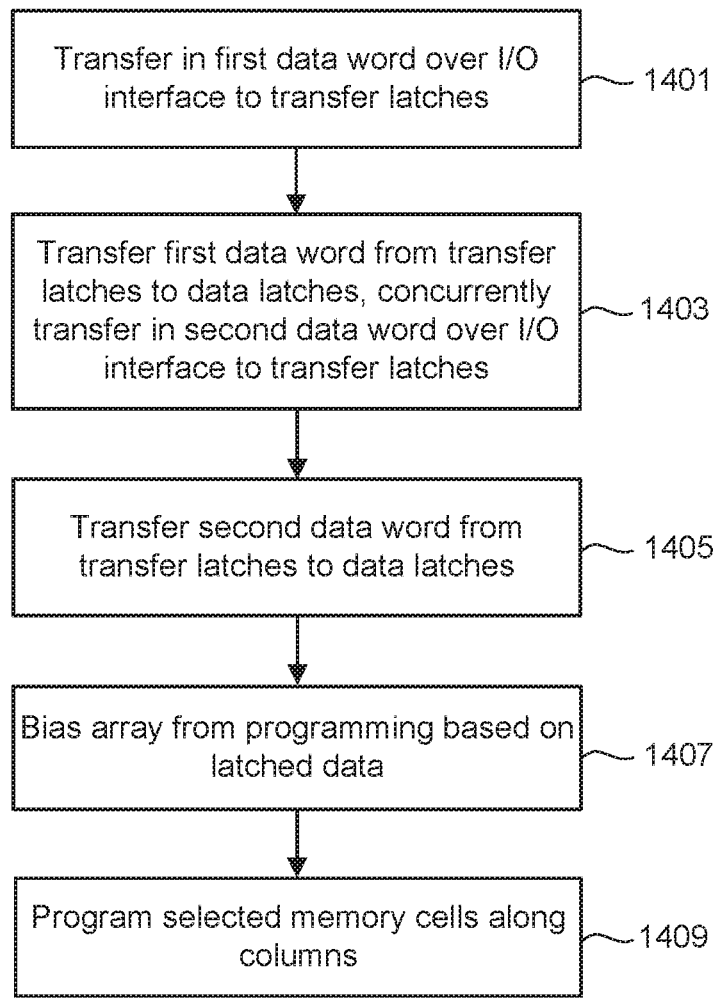
FIG. 14 is a flowchart of one embodiment for a write process using the structure of FIGS. 8 and 9.

FIG. 14 is a flowchart of one embodiment for a write process using the data latch structure of FIGS. 9 and 10, where reference is made to the processes illustrated by FIGS. 12A-12C. Beginning at step 1401, a first logic word of data to be programmed is transferred in over the I/O interface 496 to the set of XDL latches 913, as illustrated by FIG. 12A. Step 1403 corresponds to the process of FIG. 12B, with the first logic word being transferred from the set of XDL latches 913 into the set of data latches 911, while concurrently receiving a second logic word over the memory chips data bus that is transferred in over the I/O interface 496 to the set of XDL latches 917. The second logic word is then transferred from the set of XDL latches 917 into the set of data latches SDL 915 as illustrated by FIG. 12C at step 1405. For loading multi-bit write data, the values of the different bits to be stored in the latches ADL, BDL, . . . can be shifted in either first for all of the bit lines of one set (i.e., those on which logic word 0 was stored) followed by all of the bit lines of one set (i.e., those on which logic word 1 was stored), or the different bits of the two sets can be alternated.

Once the programming data has been loaded into the latches for all of the columns at the end of step 1405, the latched write data can be used for a programming operation, with the memory array being biased at step 1407. For example, based on the write data, the bit lines may be set to a program inhibit or program enable level for a subsequent programming (e.g., application of a programming pulse for memory technologies that use such a programming mechanism) at step 1409. The latched data can also be used in program verify operations in some embodiments.

In terms of timing for a write process using the structure of FIGS. 6 and 7 relative to the structures of FIGS. 8 and 9 as described with respect to FIGS. 11A-11C and 13, the time required to data into the transfer latches 713 and 717 in FIG. 7 is the same as required to the data into the transfer latches 913 and 917 in FIG. 9. With respect to the XDL to SDL transfers, although time for the XDL 917 to SDL 915 transfer of FIG. 12C and step 1405 will still be part of the program time, the time for the XDL 913 to SDL 911 to transfer is hidden behind the concurrent transfer in the second logic word, as illustrated at FIG. 12B and step 1403. Under the arrangement of FIG. 7, both the XDL 713 to SDL 711 transfer and the XDL 717 to SDL 715 transfer would individually contribute to the write time.

According to a first set of aspects, an apparatus including an array of non-volatile memory cells, a data bus, read and write circuits, and one or more control circuits. The array of non-volatile memory cells is formed along a plurality of bit lines, the bit lines arranged as a plurality of columns, including a first column and a second column, each column formed of N contiguous bit lines, N being an integer greater than one. The read and write circuits are connected to the columns and include a plurality of sets of data latches connected to the first and second columns of bit lines and a plurality of sets of transfer latches each connected to a corresponding set of the data latches. The one or more control circuits are connected to the sets of data latches and the sets of transfer latches and are configured to: store a first portion of a first data word interleaved with a first portion of a second data word along bit lines of the first column and store a second portion of the first data word interleaved with a second portion of the second data word along bit lines of the second column; and transfer the first and second portions of the second data word between the data latches and the transfer latches concurrently with transferring the first and second portions of the first data word between the transfer latches and the data bus.

In additional aspects, a method includes concurrently sensing a plurality of selected memory cells, each of the selected memory cells connected along a corresponding bit line, the bit lines arranged as a plurality of columns, including a first column and a second column, each column including a plurality of N bit lines; and latching sensing results for memory cells corresponding to each of a first subset of the bit lines of the first column and to each of a first subset of the bit lines of the second column in a data latch of a first set of data latches, including one or more latches for each of the bit lines of the first subset of the first column and of the first subset of the second column. The method also includes latching sensing results for memory cells corresponding to each of a second subset of the bit lines of the first column and to each of a second subset of the bit lines of the second column in a data latch of a second set of data latches, including one or more latches for each of the bit lines of the second subset of the first column and of the second subset of the second column. The method further includes: transferring the sensing results latched in the first set of data latches to a first set of transfer latches; and concurrently transferring the sensing results latched in the first set of transfer latches to the data bus and transferring the sensing results latched in the second set of data latches to a second set of transfer latches.

Further aspects include a method that includes receiving a first word of N bits of data, N being an integer greater than one. The method also includes transferring the first word of data to a first set of data latches, including one or more data latches associated with each of bit lines of a first subset of bit lines of a first column of N bit lines and one or more data latches associated with each bit line of a first subset of bit lines of a second column of N bit lines, comprising: transferring the first word of data to a first set of transfer latches; and subsequently transferring the first word of data from the first set of transfer latches to the first set of data latches. The method further includes receiving a second word of N bits of data, and transferring the second word of data to a second set of data latches, including one or more data latches associated with each of a second subset of bit lines of the first column of N bit lines and one or more data latches associated with each bit line of a first subset of bit lines of the second column, comprising: transferring the second word of data to a second set of transfer latches concurrently with transferring the first word of data from the first set of transfer latches to the first set of data latches.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
    an array of non-volatile memory cells formed along a plurality of bit lines, the bit lines arranged as a plurality of columns, including a first column and a second column, each column formed of N contiguous bit lines, N being an integer greater than one;
    a data bus;
    read and write circuits connected to the columns, including a plurality of sets of data latches connected to the first and second columns of bit lines and a plurality of sets of transfer latches each connected to a corresponding set of the data latches; and
    one or more control circuits connected to the sets of data latches and the sets of transfer latches and configured to:
        store a first portion of a first data word interleaved with a first portion of a second data word along bit lines of the first column and store a second portion of the first data word interleaved with a second portion of the second data word along bit lines of the second column; and
        transfer the first and second portions of the second data word between the data latches and the transfer latches concurrently with transferring the first and second portions of the first data word between the transfer latches and the data bus.

2. The apparatus of claim 1, wherein the plurality of sets of data latches includes:
    a first set of data latches connected to the first column and the second column, including one or more latches connected to each of a first subset of the bit lines of the first column and to each of a first subset of the bit lines of the second column; and
    a second set of data latches connected to the first column and the second column, including one or more latches connected to each of a second subset of the bit lines of the first column and to each of a second subset of the bit lines of the second column, and wherein the plurality of sets of transfer latches includes:
    a first set of transfer latches connected to the first set of data latches, including a latch for each of the bit lines to which the first set of data latches are connected; and
    a second set of transfer latches connected to the second set of data latches, including a latch for each of the bit lines to which the second set of data latches are connected.

3. The apparatus of claim 2, wherein the one or more control circuits are further configured to:
    concurrently transfer the first and second portions of the first data word between the first set of data latches and the first set of transfer latches;
    concurrently transfer the first and second portions of the second data word between the second set of data latches and the second set of transfer latches;
    concurrently transfer the first and second portions of the first data word between the first set of transfer latches and the data bus; and
    concurrently transfer the first and second portions of the second data word between the second set of transfer latches and the data bus,
    wherein the one more control circuits being further configured to transfer the first and second portions of the second data word between the second set of data latches and the second set of transfer latches concurrently with transferring the first and second portions of the first data word between the first set of transfer latches and the data bus.

4. The apparatus of claim 3, wherein the read and write circuits further comprises:
    a plurality of sense amplifiers, each of the sense amplifiers associated with one of the bit lines and the one or more data latches connected to the associated bit line.

5. The apparatus of claim 4, wherein the one or more control circuits are configured to:
    perform a sensing operation on a selected memory cell on each of the bit lines;
    latch a result of the sensing operation in a data latch associated with the corresponding bit line, and where when transferring data between the first and second sets of data latches and the data bus, the one or more control circuits are configured to:
    transfer the first and second portions of the first data word from the first set of data latches to the first set of transfer latches;
    subsequently transfer the first and second portions of the first data word from the first set of transfer latches and to data bus concurrently with transferring the first and second portions of the second data word from the second set of data latches to the second set of transfer latches; and
    subsequently transfer the first and second portions of the second data word from the second set of transfer latches to the data bus.

6. The apparatus of claim 3, wherein the one or more control circuits are further configured to:
    perform a write operation on a selected memory cell on each of the bit lines, including biasing bit lines connected to the first and second set of data latches according to data values stored therein.

7. The apparatus of claim 6, wherein the one or more control circuits are further configured to:

transfer the first and second portions of the first data word from the data bus to the first set of transfer latches;

subsequently transfer the first and second portions of the first data word from the first set of transfer to the first sets of data latches the concurrently with transferring the first and second portions of the second data word from the data bus to the second set of transfer latches; and subsequently transfer the first and second portions of the second data word from the second set of transfer latches to second set of data latches.

8. The apparatus of claim 6, wherein the write operation is multi-state write operation and the first and second sets of data latches include a plurality of data latches for each of the bit lines connected thereto, including a data latch for each column of each bit of multi-bit data to be programmed in the multi-state write operation.

9. The apparatus of claim 2, wherein:
the memory cells store data in a multi-bit format;
the first set of data latches includes a plurality of latches connected to each of the bit lines of the first subset of the bit lines of the first column and to each of the first subset of the bit lines of the second column, including a data latch for each bit of multi-bit data storable in the multi-bit format; and
the second set of data latches includes a plurality of latches connected to each of the second subset of the bit lines of the first column and to each of the second subset of the bit lines of the second column, including a data latch for each bit of multi-bit data storable in the multi-bit format.

10. The apparatus of claim 2, the read and write circuit further comprise:
an input/output interface through which the first and second set of transfer latches are connect to the data bus; and
an internal bus structure connecting the first set of data latches, the second set of data latches, the first set of transfer latches, the second set of transfer latches, and the input/output interface, the internal bus structure including:
a first internal bus having a width of the number of bit lines of the first subset of the first column;
a second internal bus having a width of the number of bit lines of the second subset of the first column;
a third internal bus having a width of the number of bit lines of the first subset of the second column; and
a fourth internal bus having a width of the number of bit lines of the second subset of the second column.

11. The apparatus of claim 1, wherein the first and second portions of both the first and second data words are ½ N bits of N bit data words.

12. A method, comprising
concurrently sensing a plurality of selected memory cells, each of the selected memory cells connected along a corresponding bit line, the bit lines arranged as a plurality of columns, including a first column and a second column, each column including a plurality of N bit lines;
latching sensing results for memory cells corresponding to each of a first subset of the bit lines of the first column and to each of a first subset of the bit lines of the second column in a data latch of a first set of data latches, including one or more latches for each of the bit lines of the first subset of the first column and of the first subset of the second column;
latching sensing results for memory cells corresponding to each of a second subset of the bit lines of the first column and to each of a second subset of the bit lines of the second column in a data latch of a second set of data latches, including one or more latches for each of the bit lines of the second subset of the first column and of the second subset of the second column;
transferring the sensing results latched in the first set of data latches to a first set of transfer latches; and
concurrently transferring the sensing results latched in the first set of transfer latches to a bus and transferring the sensing results latched in the second set of data latches to a second set of transfer latches.

13. The method of claim 12, further comprising:
subsequently transferring the sensing results latched in the second set of transfer latches to the data bus.

14. The method of claim 12, wherein the sensing of the selected memory cells is a multi-state sensing operation and the first set of data latches includes a plurality of latches for each of the bit lines of the first subset of the first column and each of the bit lines of the first subset of the second column.

15. The method of claim 12, wherein first and second subsets of the first and second columns each include ½ N bit lines.

16. The method of claim 12, wherein the transferring the sensing results latched in the first set of data latches to the first set of transfer latches, transferring the sensing results latched in the first set of transfer latches to a data bus, transferring the sensing results latched in the second set of data latches to the second set of transfer latches, and transferring the sensing results latched in the second set of transfer latches to the data bus is performed over an internal bus structure including a first internal bus having a width of the number of bit lines of the first subset of the first column, a second internal bus having a width of the number of bit lines of the second subset of the first column, a third internal bus having a width of the number of bit lines of the first subset of the second column, and a fourth internal bus having a width of the number of bit lines of the second subset of the second column.

17. A method, comprising:
receiving a first word of N bits of data, N being an integer greater than one;
transferring the first word of data to a first set of data latches, including one or more data latches associated with each of bit lines of a first subset of bit lines of a first column of N bit lines and one or more data latches associated with each bit line of a first subset of bit lines of a second column of N bit lines, comprising:
transferring the first word of data to a first set of transfer latches; and
subsequently transferring the first word of data from the first set of transfer latches to the first set of data latches;
receiving a second word of N bits of data; and
transferring the second word of data to a second set of data latches, including one or more data latches associated with each of a second subset of bit lines of the first column of N bit lines and one or more data latches associated with each bit line of a first subset of bit lines of the second column, comprising:
transferring the second word of data to a second set of transfer latches concurrently with transferring the first word of data from the first set of transfer latches to the first set of data latches.

18. The method of claim 17, wherein transferring the second word of data to a second set of data latches further comprises:
  subsequently transferring the second word of data from the second set of transfer latches to the second set of data latches; and
the method further comprises:
  concurrently programming the first word of data and the second word of data as stored in the first set of data latches and the second set of data latches into selected memory cells into the associated bit lines of the first column and second column.

19. The method of claim 18, wherein first and second subsets of the first and second columns each include ½ N bit lines, the bit lines of the first subset of the first column are interleaved with the second subset of bit lines of the first column, the bit lines of the first subset of the second column are interleaved with the second subset of bit lines of the second column, and programming the first word of data and the second word of data includes programming the first and second words of data to be interleaved on the bit lines of the first and second columns.

20. The method of claim 17, wherein the transferring the first word of data to the first set of transfer latches, transferring the first word of data from the first set of transfer latches to the first set of data latches, transferring the second word of data to the second set of transfer latches, and transferring the second word of data from the second set of transfer latches to the second set of data latches is performed over an internal bus structure including a first internal bus having a width of the number of bit lines of the first subset of the first column, a second internal bus having a width of the number of bit lines of the second subset of the first column, a third internal bus having a width of the number of bit lines of the first subset of the second column, and a fourth internal bus having a width of the number of bit lines of the second subset of the second column.

* * * * *